US012787499B2

(12) United States Patent
Choi et al.

(10) Patent No.: US 12,787,499 B2
(45) Date of Patent: Nov. 3, 2026

(54) DISPLAY DEVICE AND METHOD OF MANUFACTURING THE SAME

(71) Applicant: Samsung Display Co., LTD., Yongin-si (KR)

(72) Inventors: Min-Hoon Choi, Yongin-si (KR); Sanghoon Kim, Yongin-si (KR); Sunghoon Kim, Yongin-si (KR); Jingyu Sim, Yongin-si (KR); Taehyeog Jung, Yongin-si (KR); Seongjin Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 18/362,018

(22) Filed: Jul. 31, 2023

(65) Prior Publication Data

US 2024/0204135 A1 Jun. 20, 2024

(30) Foreign Application Priority Data

Dec. 14, 2022 (KR) ........................ 10-2022-0174739

(51) Int. Cl.

| | |
|---|---|
| ***H10H 20/819*** | (2025.01) |
| ***H10D 86/01*** | (2025.01) |
| ***H10H 20/85*** | (2025.01) |
| ***H10H 29/14*** | (2025.01) |
| *H10H 20/01* | (2025.01) |

(52) U.S. Cl.

CPC ...... *H10H 20/819* (2025.01); *H10D 86/0212* (2025.01); *H10H 20/8506* (2025.01); *H10H 29/142* (2025.01); *H10H 20/036* (2025.01)

(58) Field of Classification Search

CPC ............. H10H 20/819; H10H 20/8506; H10H 29/142; H10H 20/036; H10K 50/84; H10K 71/00; H10K 77/111; H10K 2102/311; H04M 1/0237; H04M 1/0268;

(Continued)

(56) References Cited

U.S. PATENT DOCUMENTS

| | | | |
|---|---|---|---|
| 9,656,910 | B2 | 5/2017 | Bazemore et al. |
| 11,072,041 | B2 | 7/2021 | Ostholt et al. |

(Continued)

FOREIGN PATENT DOCUMENTS

| | | |
|---|---|---|
| KR | 10-2019-0139843 | 12/2019 |
| KR | 10-2260931 | 6/2021 |
| KR | 10-2022-0082964 | 6/2022 |

*Primary Examiner* — Kevin Quarterman
(74) *Attorney, Agent, or Firm* — Sughrue Mion, PLLC

(57) ABSTRACT

A display device includes a display panel including a first non-folding area, a second non-folding area, and a folding area disposed between the first non-folding area and the second non-folding area and a support member disposed under the display panel, including a glass, and including a first non-folding portion overlapping the first non-folding area in a plan view, a second non-folding portion overlapping the second non-folding area in a plan view, and a folding portion disposed between the first non-folding portion and the second non-folding portion, overlapping the folding area in a plan view, and including an opening pattern including openings extending in a first direction and having a width in a second direction intersecting the first direction of in a range of about 10 micrometers to about 200 micrometers.

16 Claims, 20 Drawing Sheets

(58) Field of Classification Search
CPC ...... G06F 1/1641; G06F 1/1652; G09F 9/301; G09F 9/335; H10D 86/0212
See application file for complete search history.

(56) References Cited

U.S. PATENT DOCUMENTS

| | | | | |
|---|---|---|---|---|
| 2022/0223806 | A1* | 7/2022 | Ostholt | H10K 71/851 |
| 2022/0319357 | A1* | 10/2022 | Ahn | G09F 9/301 |
| 2022/0374046 | A1* | 11/2022 | Kim | H04M 1/0214 |
| 2024/0188411 | A1* | 6/2024 | Jia | H10K 77/111 |

* cited by examiner

GT1:GAT1
GT2:GAT2,CE
GT3:GAT3
SD1:SE1,DE1,SE2,DE2
SD2:CP

CRT

DISPLAY DEVICE AND METHOD OF MANUFACTURING THE SAME

CROSS REFERENCE TO RELATED APPLICATION(S)

This application claims priority to and the benefits of Korean Patent Application No. 10-2022-0174739 under 35 U.S.C. § 119, filed on Dec. 14, 2022, in the Korean Intellectual Property Office (KIPO), the entire contents of which are incorporated herein by reference.

BACKGROUND

1. Technical Field

The disclosure relates to a display device and a method of manufacturing the display device.

2. Description of the Related Art

Recently, a flexible display device that can be deformed into various shapes has been developed. Unlike a flat panel display, the flexible display device can be folded, bent, or rolled like a paper. The flexible display device is readily carriable and may improve user convenience.

Recently, among flexible display devices, a foldable display device is in the limelight. The foldable display device can be repeatedly folded and unfolded. The foldable display device may include a display module having a flexible characteristic and a support member disposed on a bottom surface of the display module. The support member has relatively high rigidity, and may serve to prevent deformation of the display module due to a user's touch or the like.

SUMMARY

Embodiments provide a display device with improved impact resistance.

Embodiments provide a method for manufacturing the display device.

A display device according to an embodiment may include a display panel including a first non-folding area, a second non-folding area, and a folding area disposed between the first non-folding area and the second non-folding area and a support member disposed under the display panel, including a glass, and including a first non-folding portion overlapping the first non-folding area in a plan view, a second non-folding portion overlapping the second non-folding area in a plan view, and a folding portion disposed between the first non-folding portion and the second non-folding portion, overlapping the folding area in a plan view, and including an opening pattern including openings extending in a first direction and having a width in a second direction intersecting the first direction of in a range of about 10 micrometers to about 200 micrometers.

In an embodiment, a shape of each of the openings included in the opening pattern may be a rectangle, a rhombus, an ellipse, a wavy shape, or a rectangle with rounded corners.

In an embodiment, a thickness of the support member may be in a range of about 10 micrometers to about 300 micrometers.

In an embodiment, the display panel may include a circuit device layer disposed on the support member and including at least one transistor and a light emitting device layer disposed on the circuit device layer and including at least one light emitting diode.

A method of manufacturing a display device according to an embodiment may include forming a carrier substrate including a glass, forming a modified portion on the carrier substrate by radiating a laser on the carrier substrate, forming a display panel directly contacting the carrier substrate and including a first non-folding area, a second non-folding area, and a folding area disposed between the first non-folding area and the second non-folding area on the carrier substrate, and forming a support member by etching the carrier substrate to form an opening pattern overlapping the folding area in a plan view.

In an embodiment, the forming of the display panel may be performed after the forming of the modified portion.

In an embodiment, the forming of the support member may include forming the opening pattern by etching the modified portion.

In an embodiment, an etching rate of the modified portion may be greater than an etching rate of a portion of the carrier substrate other than the modified portion.

In an embodiment, the modified portion may be formed overlapping the folding area in a plan view.

In an embodiment, the opening pattern may include openings, and each of the openings may extend in a first direction and have a width in a second direction intersecting the first direction in a range of about 10 micrometers to about 200 micrometers.

In an embodiment, the carrier substrate may include a first surface contacting the display panel and a second surface opposite to the first surface.

In an embodiment, the modified portion may be spaced apart from the first surface of the carrier substrate and the second surface of the carrier substrate.

In an embodiment, the modified portion may be spaced apart from the first surface of the carrier substrate by a length in a range of about 20% to about 80% of a thickness of the carrier substrate in a thickness direction of the carrier substrate.

In an embodiment, the modified portion may be spaced apart from the second surface of the carrier substrate by a length in a range of about 20% to about 80% of a thickness of the carrier substrate in a thickness direction of the carrier substrate.

In an embodiment, the etching of the carrier substrate may be performed by a wet etching method.

In an embodiment, in the etching of the carrier substrate, an etching solution may be applied on an entire area of the second surface.

In an embodiment, the etching solution may include at least one of fluorine hydrogen, sodium hydroxide, and potassium hydroxide.

A method of manufacturing a display device according to an embodiment may include forming a carrier substrate including a glass, forming a modified portion on a first surface of the carrier substrate by radiating a laser on the first surface of the carrier substrate, forming a display panel directly contacting the first surface of the carrier substrate and including a first non-folding area, a second non-folding area, and a folding area disposed between the first non-folding area and the second non-folding area on the carrier substrate, and forming a support member by etching the carrier substrate to form an opening pattern overlapping the folding area in a plan view.

In an embodiment, the modified portion may extend from the first surface of the carrier substrate to inside of the carrier substrate, and may be spaced apart from a second surface opposite to the first surface of the carrier substrate.

In an embodiment, the method may further include performing a planarization of the first surface of the carrier substrate before the forming of the display panel.

In the display device according to embodiments, the display device may include an opening pattern including openings having a width in a range of about 10 micrometers to about 200 micrometers in a folding portion. An area of the support member supporting a lower portion of the display panel may be increased. Accordingly, an impact resistance of the display device may be improved. Also, cracks and creases of the display device may be prevented or reduced, and a reliability of the display device may be improved.

Since the modified portion is formed on the carrier substrate, the modified portion may not be etched from a beginning. Therefore, since the modified portion having a relatively higher etching rate is not etched from the beginning, the width of each of the openings of the opening pattern formed by the modified portion may be reduced. Accordingly, cracks and creases of the display device may be prevented or reduced, and the reliability of the display device may be improved.

It is to be understood that both the foregoing general description and the following detailed description are embodiments and are intended to provide further explanation of the disclosure as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
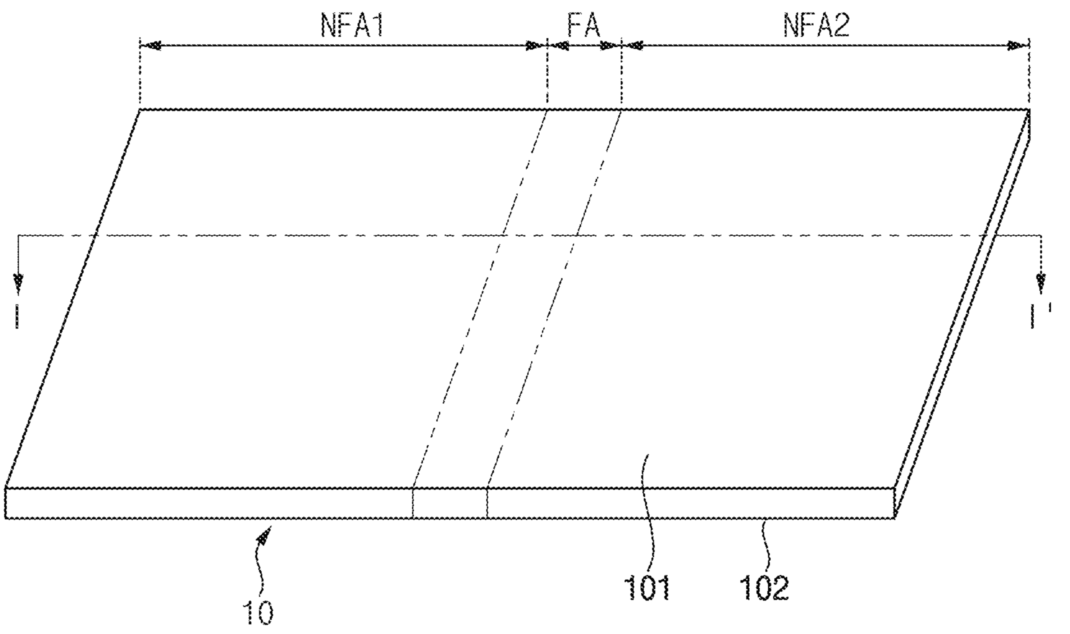
FIG. 1 is a schematic perspective view illustrating an unfolded state of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another.

The display surface may be parallel to a surface defined by a first direction DR1 and a second direction DR2. A normal direction of the display surface, i.e., a thickness direction of the display device DD, may indicate a third direction DR3. In this specification, an expression of "when viewed from a plane or on a plane" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The disclosure will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be more thorough and complete, and will fully convey the scope of the disclosure to those skilled in the art. Like reference numerals refer to like elements throughout.

Figure 2:
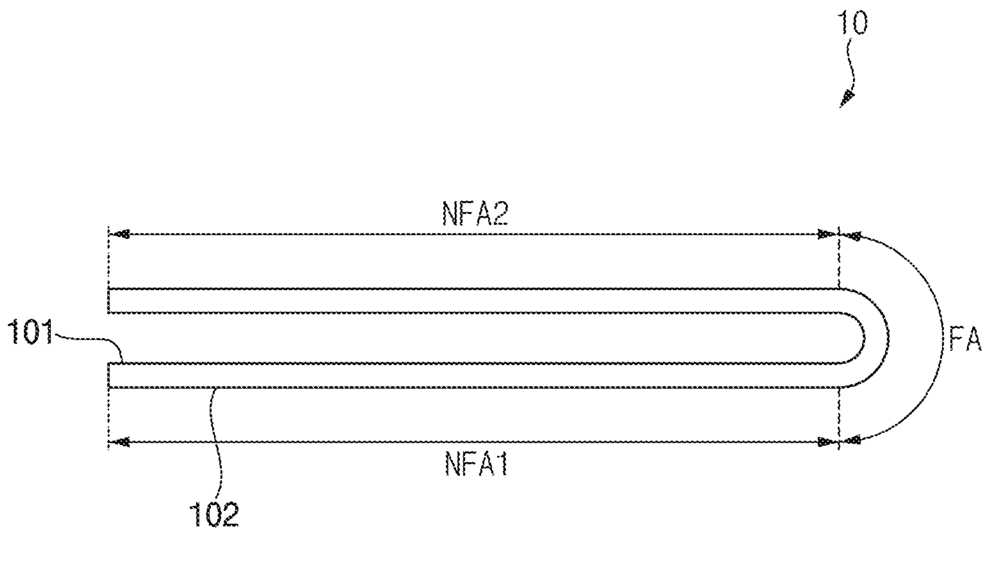
FIG. 2 is a schematic cross-sectional view illustrating a folded state of the display device of FIG. 1.

FIG. 1 is a schematic perspective view illustrating an unfolded state of a display device according to an embodiment. FIG. 2 is a schematic cross-sectional view illustrating a folded state of the display device of FIG. 1.

Referring to FIGS. 1 and 2, the display device 10 may include a display surface 101 and a non-display surface 102 opposite to the display surface 101. The display surface 101 may be a surface on which an image is displayed on the display device 10. The non-display surface 102 may be a surface on which an image is not displayed on the display device 10. In an embodiment, an image may also be displayed on the non-display surface 102. For example, an image may be displayed on a portion of the non-display surface 102. In another example, an image may be displayed on entire of the non-display surface 102.

The display device 10 may have a stacked structure. For example, the display device 10 may include several layers having different functions. Each of the several layers may have a flexible characteristic, and the display device 10 may have a flexible characteristic.

The display device 10 may include a first non-folding area NFA1, a second non-folding area NFA2, and a folding area FA positioned between the first non-folding area NFA1 and the second non-folding area NFA2.

The display device 10 may not be folded in the first non-folding area NFA1 and the second non-folding area NFA2. The display device 10 may have a flat surface in the first non-folding area NFA1 and the second non-folding area NFA2.

The display device 10 may be folded and unfolded in the folding area FA. The display device 10 may be folded (see, e.g., a folded state of the display device 10 in FIG. 2) or unfolded (see, e.g., an unfolded state of the display device 10 in FIG. 1) in the folding area FA. Also, the display device 10 may be in-folded or out-folded. For example, the display device 10 may be in-folded so that the display surface 101 face each other (see, e.g., the folded state in FIG. 2). For example, the display device 10 may be out-folded so that the non-display surface 102 face each other.

However, the disclosure is not limited thereto, and in another embodiment, the display device 10 may further include a third non-folding area adjacent to the second non-folding area NFA2. The display device 10 may further include a folding area between the second non-folding area NFA2 and the third non-folding area. Also, in another embodiment, a width of the folding area FA may be wide. Accordingly, the display device 10 may slide in the folding area FA, and an area of the display surface 101 may be adjusted.

Figure 3:
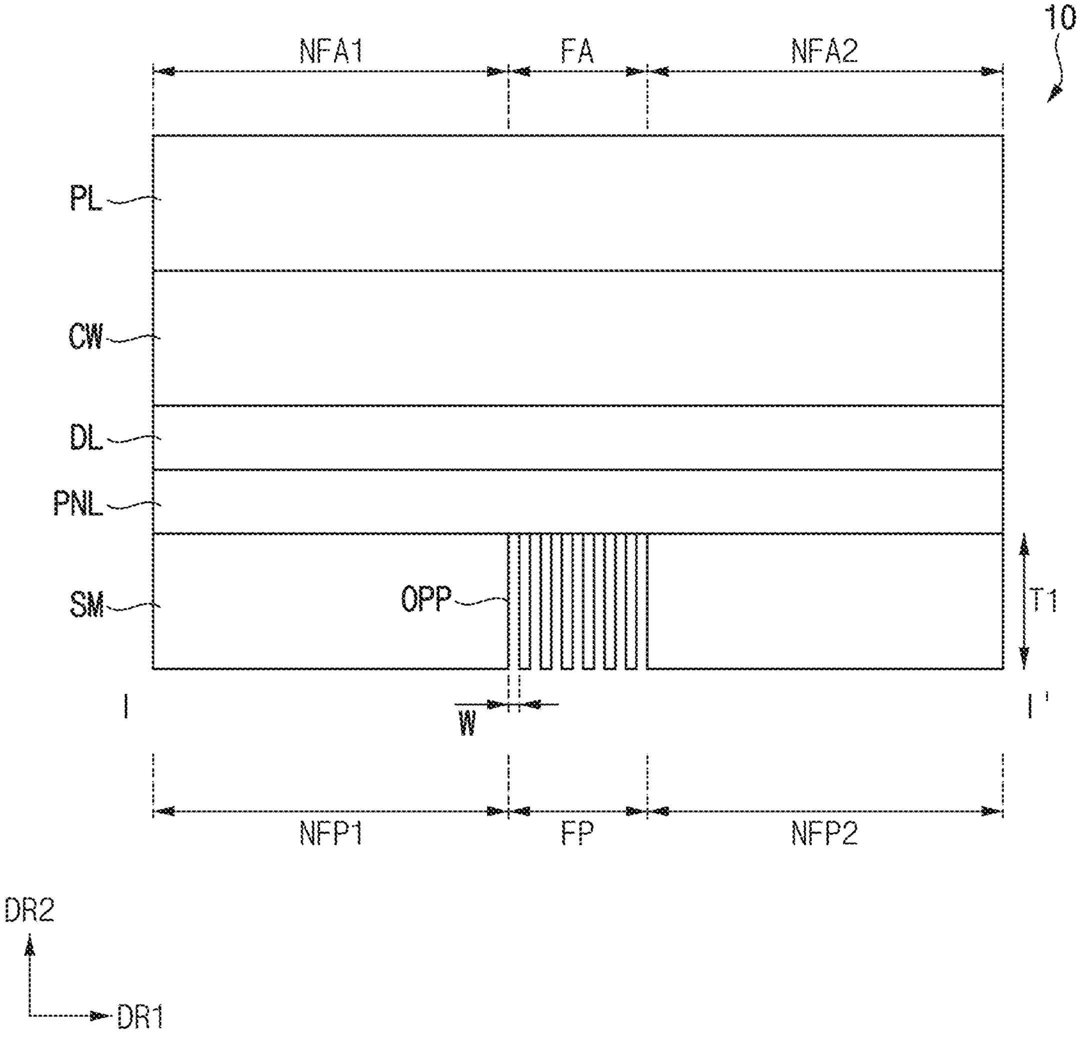
FIG. 3 is a schematic cross-sectional view taken along line I-I' of FIG. 1.
Figure 4:
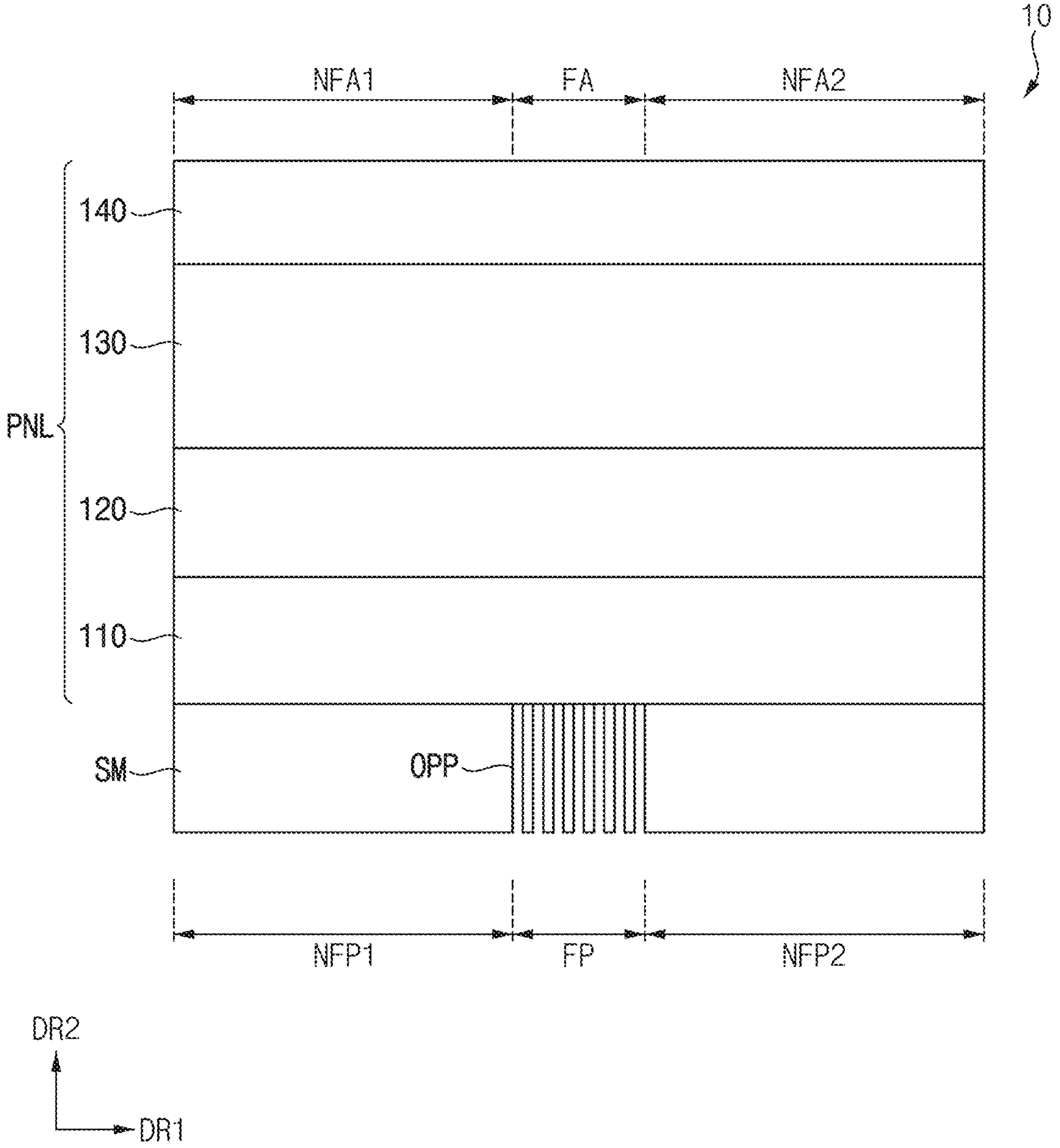
FIG. 4 is a schematic cross-sectional view illustrating only a support member and a display panel of FIG. 3.

FIG. 3 is a schematic cross-sectional view taken along line I-I' of FIG. 1. FIG. 4 is a schematic cross-sectional view illustrating only a support member and a display panel of FIG. 3.

Further referring to FIG. 3, the display device 10 may include a support member SM, a display panel PNL, a damping layer DL, a cover window CW, and a protective film PL. As described above, since the display device 10 may be folded or unfolded, each of the support member SM, the display panel PNL, the damping layer DL, the cover window CW, and the protective film PL may have flexible properties.

The support member SM may be disposed under the display panel PNL and support the display panel PNL, and may emit or disperse heat generated from the display panel PNL. Also, the support member SM may prevent foreign matter from being introduced into the display panel PNL from outside.

The support member SM may include a first non-folding portion NFP1, a second non-folding portion NFP2, and a folding portion FP. The folding portion FP may be disposed between the first non-folding portion NFP1 and the second non-folding portion NFP2. The first non-folding portion NFP1 may overlap the first non-folding area NFA1 in a plan view, the second non-folding portion NFP2 may overlap the second non-folding area NFA2 in a plan view, and the folding portion FP may overlap the folding area FA in a plan view. In an embodiment, the support member SM may include a glass or the like.

A thickness T1 of the support member SM may be in a rage of about 10 micrometers to about 300 micrometers in a thickness direction of the display device 10. In case that the thickness T1 of the support member SM is less than about 10 micrometers, an impact resistance of the support member SM may decrease, and the support member SM may be readily damaged. The support member SM may not properly support the display device 10. In case that the thickness T1 of the support member SM is greater than about 300 micrometers, the folding portion FP may not be readily folded.

In an embodiment, the folding portion FP may include an opening pattern OPP. The opening pattern OPP may include multiple openings HL (see, e.g., FIG. 6). However, the disclosure is not limited thereto. The openings HL of the opening pattern OPP may be maintained empty. However, the disclosure is not limited thereto, and a filling material may be filled inside the openings HL of the opening pattern OPP.

The display panel PNL may be disposed on the support member SM. The display panel PNL may include multiple pixels, and an image may be generated by combining light emitted from each of the pixels.

Referring further to FIG. 4, since the display device 10 includes the first non-folding area NFA1, the second non-folding area NFA2, and the folding area FA, the display panel PNL may include the first non-folding area NFA1, the second non-folding area NFA2, and the folding area FA.

The display panel PNL may include a circuit device layer 110, a light emitting device layer 120, an encapsulation layer 130, and a touch sensing layer 140.

The circuit device layer 110 may be disposed on the support member SM. The circuit device layer 110 may include insulating layers and conductive layers. The circuit device layer 110 may include at least one transistor. The light emitting device layer 120 may be formed on the circuit device layer 110. The light emitting device layer 120 may include at least one light emitting diode. The light emitting device layer 120 may emit light, and the circuit device layer 110 may drive the light emitting device layer 120.

The encapsulation layer 130 may be disposed on the light emitting device layer 120. The encapsulation layer 130 may prevent penetration of moisture and oxygen into the light emitting diode from outside. The encapsulation layer 130 may include at least one of an organic encapsulation layer and an inorganic encapsulation layer.

The touch sensing layer 140 may be disposed on the encapsulation layer 130. The touch sensing layer 140 may include at least one touch electrode.

Referring back to FIG. 3, the damping layer DL may be disposed on the display panel PNL. The damping layer DL may be disposed on the touch sensing layer 140. The damping layer DL may absorb external shocks to improve an impact resistance of the display device 10.

The cover window CW may be disposed on the damping layer DL. The cover window CW may serve to protect the display panel PNL. The cover window CW may be formed of a transparent material.

For example, the cover window CW may include an ultra-thin tempered glass. The ultra-thin tempered glass may be strengthened to have a stress profile. The ultra-thin tempered glass, which has been strengthened, may be more resistant to crack generation, propagation of cracks, damage, or the like due to external impact than before tempering (or strengthening). The ultra-thin tempered glass strengthened through the strengthening process may have various stresses for each area.

In case that the cover window CW is made of an ultra-thin film or a thin film, the cover window CW may have a flexible property and may be bent, folded, or rolled. The cover window CW may include soda lime glass, alkali alumino silicate glass, borosilicate glass, lithium alumina silicate glass, the like, or a combination thereof. The ultra-thin tempered glass of the cover window CW may be a thin glass which is chemically strengthened to have high strength. However, the disclosure is not limited thereto, and the ultra-thin tempered glass of the cover window CW may be a thermally strengthened thin glass or the like.

The protective film PL may be disposed on the cover window CW. The protective film PL may perform at least one function of preventing scattering of the cover window CW, shock absorption, stamping prevention, fingerprint prevention, and glare prevention. The protective film PL may include a transparent polymer film or the like. The transparent polymer film that may be used for the protective film PL may be made of at least one of an epoxy resin, polyurethane, polyester, polyethylene terephthalate, polyethylene naphthalate, polyimide, polyarylate, polycarbonate, polymethyl methacrylate, ethyl vinyl acetate, a polyamide resin, and the like.

The display device 10 may further include an adhesive layer between each layer. The adhesive layer may attach upper and lower layers adjacent to each other. However, the disclosure is not limited thereto, and the adhesive layer may be omitted.

The disclosure is not limited thereto, and the display device 10 may further include additional modules.

Figure 5:
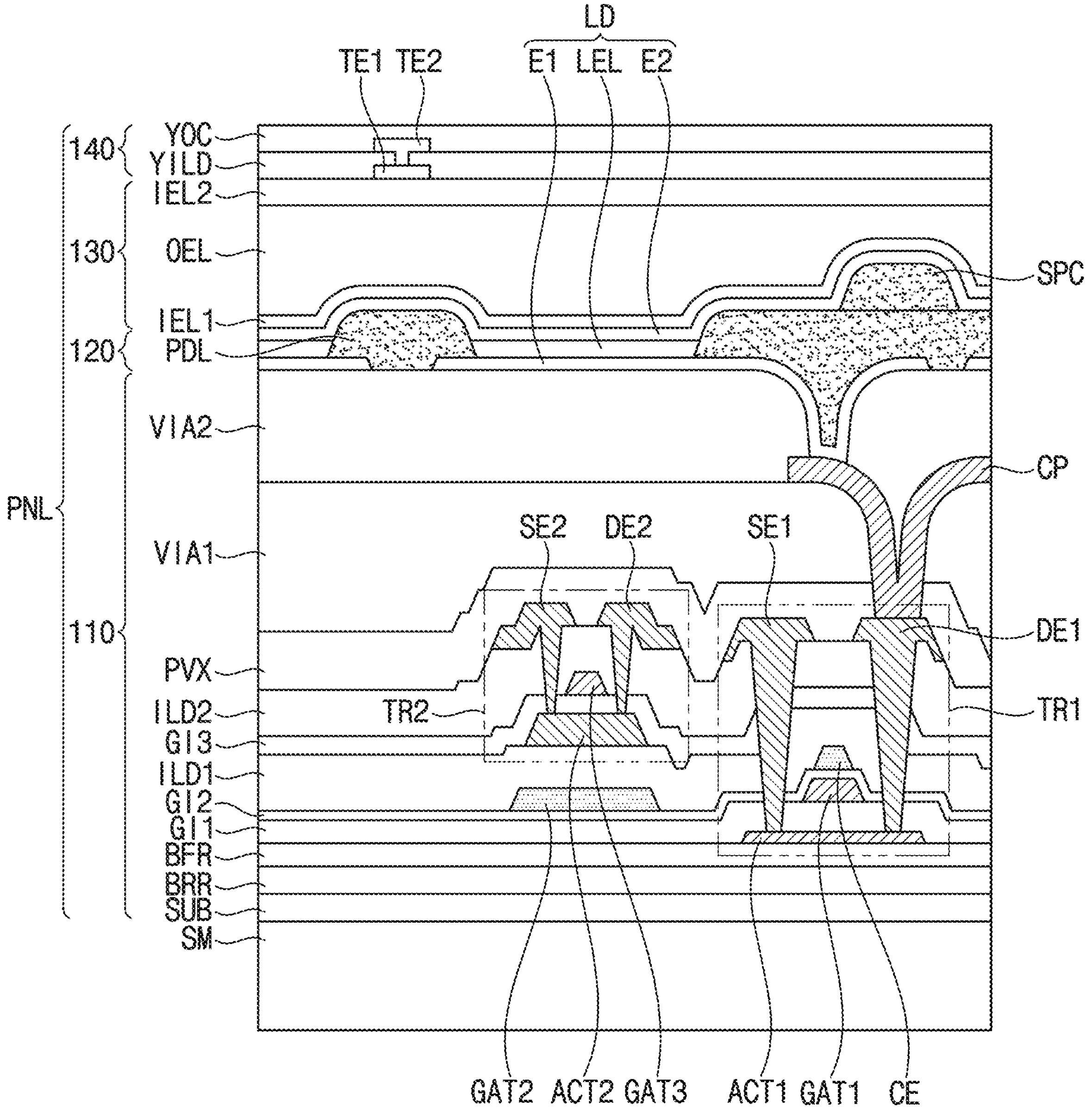
FIG. 5 is a schematic enlarged view of a portion of a support member and a display panel of FIG. 4.

FIG. 5 is a schematic enlarged view of a portion of a support member and a display panel of FIG. 4.

Referring further to FIG. 5, the circuit device layer 110 may be disposed on the support member SM, and include at least one transistor. The circuit device layer 110 may include a base substrate SUB, a barrier layer BRR, a buffer layer BFR, multiple insulating layers, a first active layer ACT1, a first gate layer GT1, a second gate layer GT2, a second active layer ACT2, a third gate layer GT3, a first conductive layer SD1, and a second conductive layer SD2.

The base substrate SUB may be disposed on the support member SM. The base substrate SUB may contact the support member SM. The base substrate SUB may prevent permeation of external moisture. The base substrate SUB may include polyimide or the like. The base substrate SUB may have a single layer or multiple layers.

The barrier layer BRR may be disposed on the base substrate SUB. The barrier layer BRR may prevent permeation of external moisture. For example, the barrier layer BRR may include silicon oxide or the like.

The buffer layer BFR may be disposed on the barrier layer BRR. The buffer layer BFR may prevent diffusion of metal atoms or impurities from the support member SM. For example, the buffer layer BFR may be formed of a double layer. A layer may include silicon oxide or the like. Another layer may include silicon nitride or the like. However, the disclosure is not limited thereto, and the buffer layer BFR may be formed of one (or single) layer or at least two layers.

The first active layer ACT1 may be disposed on the buffer layer BFR. The first active layer ACT1 may be divided into a source area and a drain area doped with an impurity and a channel area between the source area and the drain area. For example, the first active layer ACT1 may include a silicon semiconductor or the like.

A first gate insulating layer GI1 may cover the first active layer ACT1 and may be disposed on the buffer layer BFR. The first gate insulating layer GI1 may include an inorganic material. For example, the first gate insulating layer GI1 may include silicon oxide or the like.

The first gate layer GT1 may be disposed on the first gate insulating layer GI1. The first gate layer GT1 may include a first gate electrode GAT1. The first gate electrode GAT1 may overlap the channel area of the first active layer ACT1 in a plan view.

A second gate insulating layer GI2 may cover the first gate layer GT1 and may be disposed on the first gate insulating layer GI1. The second gate insulating layer GI2 may include an inorganic material. For example, the second gate insulating layer GI2 may include silicon nitride or the like.

The second gate layer GT2 may be disposed on the second gate insulating layer GI2. The second gate layer GT2 may include a capacitor electrode CE and a second gate electrode GAT2. The capacitor electrode CE may overlap the first gate electrode GAT1 in a plan view. The capacitor electrode CE and the first gate electrode GAT1 may constitute a first storage capacitor. The second gate electrode GAT2 may be spaced apart from the capacitor electrode CE.

A first interlayer insulating layer ILD1 may cover the second gate layer GT2 and may be disposed on the second gate insulating layer GI2. The first interlayer insulating layer ILD1 may be formed of a double layer. A layer may include silicon oxide or the like and another layer may include silicon nitride or the like. However, the disclosure is not limited thereto, and the first interlayer insulating layer ILD1 may be formed of one layer or at least two layers.

The second active layer ACT2 may be disposed on the first interlayer insulating layer ILD1. The second active layer ACT2 may be divided into a source area and a drain area doped with an impurity and a channel area between the source area and the drain area. For example, the second active layer ACT2 may include an oxide semiconductor. For example, the second active layer ACT2 and the first active layer ACT1 may include different materials. However, the disclosure is not limited thereto, and the second active layer ACT2 and the first active layer ACT1 may include a same material.

A third gate insulating layer GI3 may cover the second active layer ACT2 and may be disposed on the first interlayer insulating layer ILD1. The third gate insulating layer GI3 may include an inorganic material. For example, the third gate insulating layer GI3 may include silicon oxide or the like.

The third gate layer GT3 may be disposed on the third gate insulating layer GI3. The third gate layer GT3 may include a third gate electrode GAT3. The third gate electrode GAT3 may overlap the channel area of the second active layer ACT2 in a plan view. The third gate electrode GAT3 may overlap the second gate electrode GAT2 in a plan view. The third gate electrode GAT3 and the second gate electrode GAT2 may constitute a second storage capacitor. However, the disclosure is not limited thereto.

A second interlayer insulating layer ILD2 may cover the third gate layer GT3 and may be disposed on the third gate insulating layer GI3. The second interlayer insulating layer ILD2 may be formed of a double layer. A layer may include silicon oxide or the like and another layer may include silicon nitride or the like. However, the disclosure is not limited thereto, and the second interlayer insulating layer ILD2 may be formed of one layer or at least two layers.

The first conductive layer SD1 may be disposed on the second interlayer insulating layer ILD2. The first conductive layer SD1 may include a first source electrode SE1, a first drain electrode DE1, a second source electrode SE2, and a second drain electrode DE2. The first source electrode SE1 and the first drain electrode DE1 may be connected to the first active layer ACT1. The second source electrode SE2 and the second drain electrode DE2 may be connected to the second active layer ACT2.

The first active layer ACT1, the first gate electrode GAT1, the first source electrode SE1, and the first drain electrode DE1 may constitute a first transistor TR1. The second active layer ACT2, the third gate electrode GAT3, the second source electrode SE2, and the second drain electrode DE2 may constitute a second transistor TR2.

A passivation layer PVX may cover the first conductive layer SD1 and may be disposed on the second interlayer insulating layer ILD2. The passivation layer PVX may include an inorganic material. For example, the passivation layer PVX may include silicon nitride or the like.

A first via insulating layer VIA1 may be disposed on the passivation layer PVX. The first via insulating layer VIA1 may include an organic material. For example, the first via insulating layer VIA1 may include polyimide or the like. The first via insulating layer VIA1 may planarize an upper surface of a stacked structure (i.e., the passivation layer PVX, the first conductive layer SD1, or the like).

The second conductive layer SD2 may be disposed on the first via insulating layer VIA1. The second conductive layer SD2 may include a connection electrode CP. The connection electrode CP may contact the first drain electrode DE1 of the first transistor TR1. The connection electrode CP may connect a light emitting diode LD and the first transistor TR1. The light emitting diode LD will be described below.

A second via insulating layer VIA2 may be disposed on the first via insulating layer VIA1. The second via insulating layer VIA2 may include an organic material. For example, the second via insulation layer VIA2 may include polyimide or the like. The second via insulating layer VIA2 may planarize an upper surface of a stacked structure (i.e., the first via insulating layer VIA1, the passivation layer PVX, or the like).

The light emitting device layer 120 may be disposed on the circuit device layer 110. The light emitting device layer 120 may include at least one light emitting diode LD, a pixel defining layer PDL, and a spacer SPC. The light emitting diode LD may include a first electrode E1, an emission layer LEL, and a second electrode E2.

The first electrode E1 may be disposed on the second via insulating layer VIA2. The first electrode E1 may contact the connection electrode CP. The first electrode E1 may be electrically connected to the first transistor TR1 through the connection electrode CP.

The pixel defining layer PDL may be disposed on the second via insulating layer VIA2. An opening exposing an upper surface of the first electrode E1 may be formed on the pixel defining layer PDL. The pixel defining layer PDL may include an organic material or an inorganic material. For example, the pixel defining layer PDL may include polyimide or the like.

The spacer SPC may be disposed on the pixel defining layer PDL. The spacer SPC may include an organic material or an inorganic material. The spacer SPC may maintain a gap between the encapsulation layer 130 and the support member SM.

The spacer SPC may include an organic material or an inorganic material. The pixel defining layer PDL and the spacer SPC may include a same material. For example, the pixel defining layer PDL and the spacer SPC may include an organic material such as polyimide or the like. Also, the pixel defining layer PDL and the spacer SPC may be simultaneously formed using a halftone mask. However, the disclosure is not limited thereto, and the pixel defining layer PDL and the spacer SPC may be formed of different materials. The spacer SPC may be formed after the pixel defining layer PDL is formed.

The emission layer LEL may be disposed on the first electrode E1. The emission layer LEL may be disposed in the opening formed on the pixel defining layer PDL. In an embodiment, the emission layer LEL may have a multilayer structure including layers such as a hole injection layer, a hole transport layer, an organic light emitting layer, an electron transport layer, an electron injection layer, and the like. The organic light emitting layer may include a light emitting material.

The second electrode E2 may cover the emission layer LEL and may be disposed on the pixel defining layer PDL and the spacer SPC. In an embodiment, the second electrode E2 may have a plate shape. The second electrode E2 may have light transmitting or reflecting properties. For example, the second electrode E2 may include a metal or the like.

The encapsulation layer 130 may be disposed on the light emitting device layer 120. The encapsulation layer 130 may prevent penetration of moisture and oxygen into the light emitting diode LD from outside. For example, the encapsulation layer 130 may include a first inorganic encapsulation layer IEL1, an organic encapsulation layer OEL, and a second inorganic encapsulation layer IEL2.

The first inorganic encapsulation layer IEL1 may be formed with a substantially constant thickness on the second electrode E2 along a profile of the second electrode E2. The organic encapsulation layer OEL may be formed on the first inorganic encapsulation layer IEL1, and may have a substantially flat upper surface without creating a step of the first inorganic encapsulation layer IEL1. The second inorganic encapsulation layer IEL2 may be formed on the organic encapsulation layer OEL.

The touch sensing layer 140 may be disposed on the encapsulation layer 130. The touch sensing layer 140 may include a first touch electrode TE1, a touch insulating layer YILD, a second touch electrode TE2, and a touch planarization layer YOC.

The first touch electrode TE1 may be disposed on the encapsulation layer 130. For example, the first touch electrode TE1 may be disposed on the second inorganic encapsulation layer IEL2. The touch insulating layer YILD may be disposed on the first touch electrode TE1, the second touch electrode TE2 may be disposed on the touch insulating layer YILD, and the touch planarization layer YOC may be disposed on the second touch electrode TE2. The touch planarization layer YOC may have a substantially flat upper surface. The touch planarization layer YOC may be substantially parallel to an upper surface of the light emitting diode LD. The second touch electrode TE2 may be connected to the first touch electrode TE1 through a contact hole. The touch sensing layer 140 may function as an input means of the display device 10.

FIGS. 6 to 9 are schematic plan views illustrating the support member of FIG. 3.

Referring further to FIGS. 6 to 9, the opening pattern OPP, OPP', OPP'', or OPP''' may include multiple openings HL. Each of the openings HL may have a rectangular shape, a rhombus shape, an elliptical shape, a wavy shape, or a rectangular shape with rounded corners in a plan view. The opening pattern OPP may be formed by removing a portion of the folding portion FP, FP', FP'', or FP''' of the support member SM.

Figure 6:
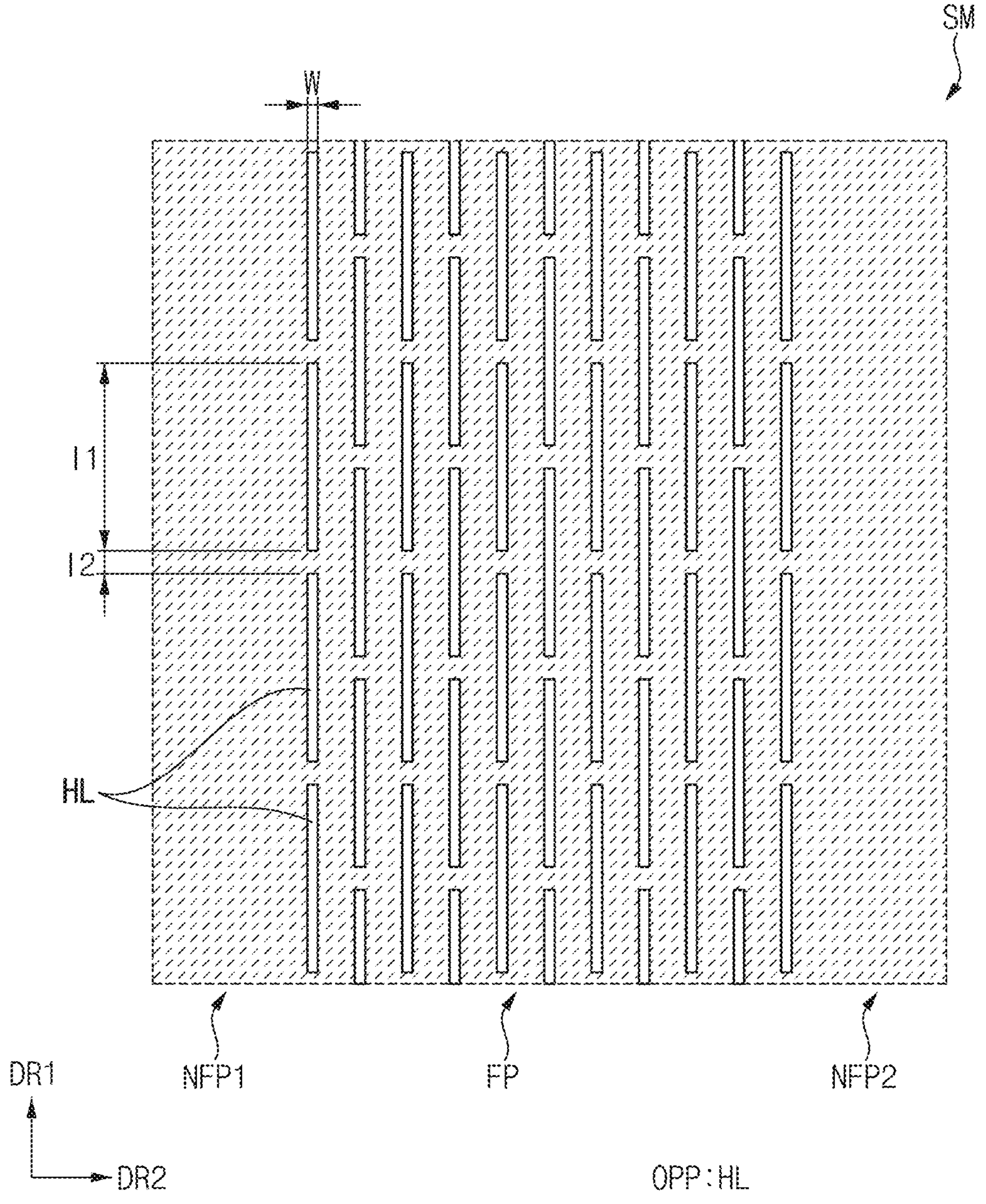
FIG. 6 is a schematic plan view illustrating the support member of FIG. 3 according to an embodiment.

Referring to FIGS. 3 and 6, the opening pattern OPP of the folding portion FP according to an embodiment may include the openings HL. Each of the openings HL may extend in a first direction DR1. For example, a long side of each of the openings HL may be parallel to the first direction DR1. Also, a width W of each of the openings HL in the second direction DR2 may be in a range of about 10 micrometers to about 200 micrometers. The second direction DR2 may intersect the first direction DR1.

In case that the width W of each of the openings HL in the second direction DR2 is less than about 10 micrometers, the opening pattern OPP may have a small opening HL. Therefore, the display device 10 in the folding area FA may not be readily folded. Also, in case that the width W of each of the openings HL in the second direction DR2 is less than about 10 micrometers, the openings HL may cause cracks in the support member SM. Therefore, a reliability of the display device 10 may decrease.

In case that the width W of each of the openings HL in the second direction DR2 is greater than about 200 micrometers, the width W of each of the openings HL may be greater than a width of a pen when the pen is dropped. Accordingly, when a pen is dropped, members (e.g., display panel PNL) on the support member SM overlapping the openings HL in a plan view may droop. Therefore, the impact resistance of the display device 10 may decrease. Also, in case that the width W of each of the openings HL in the second direction DR2 is greater than about 200 micrometers, a modulus of the foldable portion FP of the support member SM may low. As a result, crease may occur in the folding portion FP.

Each of the openings HL may have a same shape in a plan view. For example, each of the openings HL may have a same shape such as a rectangular shape or the like. The rectangular shape may have a specific length l1 and colinearly arranged openings HL may be spaced apart from each other by a specific interval l2 in the first direction DR1. Openings HL arranged in a column (or a specific column) may be aligned with or staggered with Openings HL arranged in adjacent columns.

Figure 7:
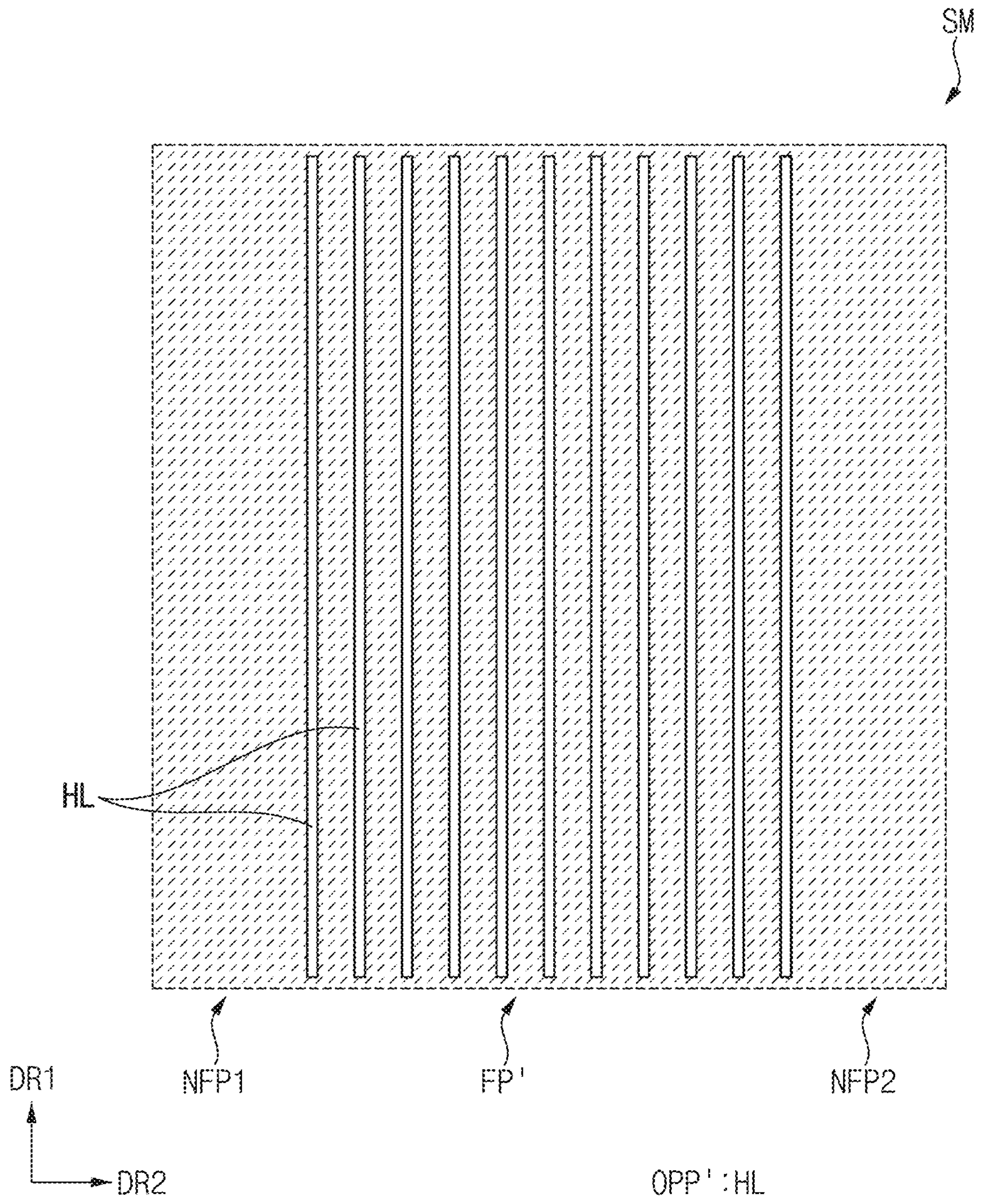
FIG. 7 is a schematic plan view illustrating the support member of FIG. 3 according to an embodiment.

Referring to FIG. 7, the opening pattern OPP' of the folding portion FP' may include the openings HL. Each of the openings HL may have a same shape in a plan view. For example, each of the openings HL may have a same shape such as a rectangular shape or the like, and each of the openings HL may have a shape extending in the first direction DR1. In the opening pattern OPP' of the folding portion FP', only one opening extending in the first direction DR1 may be disposed in a column (or a specific column).

Figure 8:
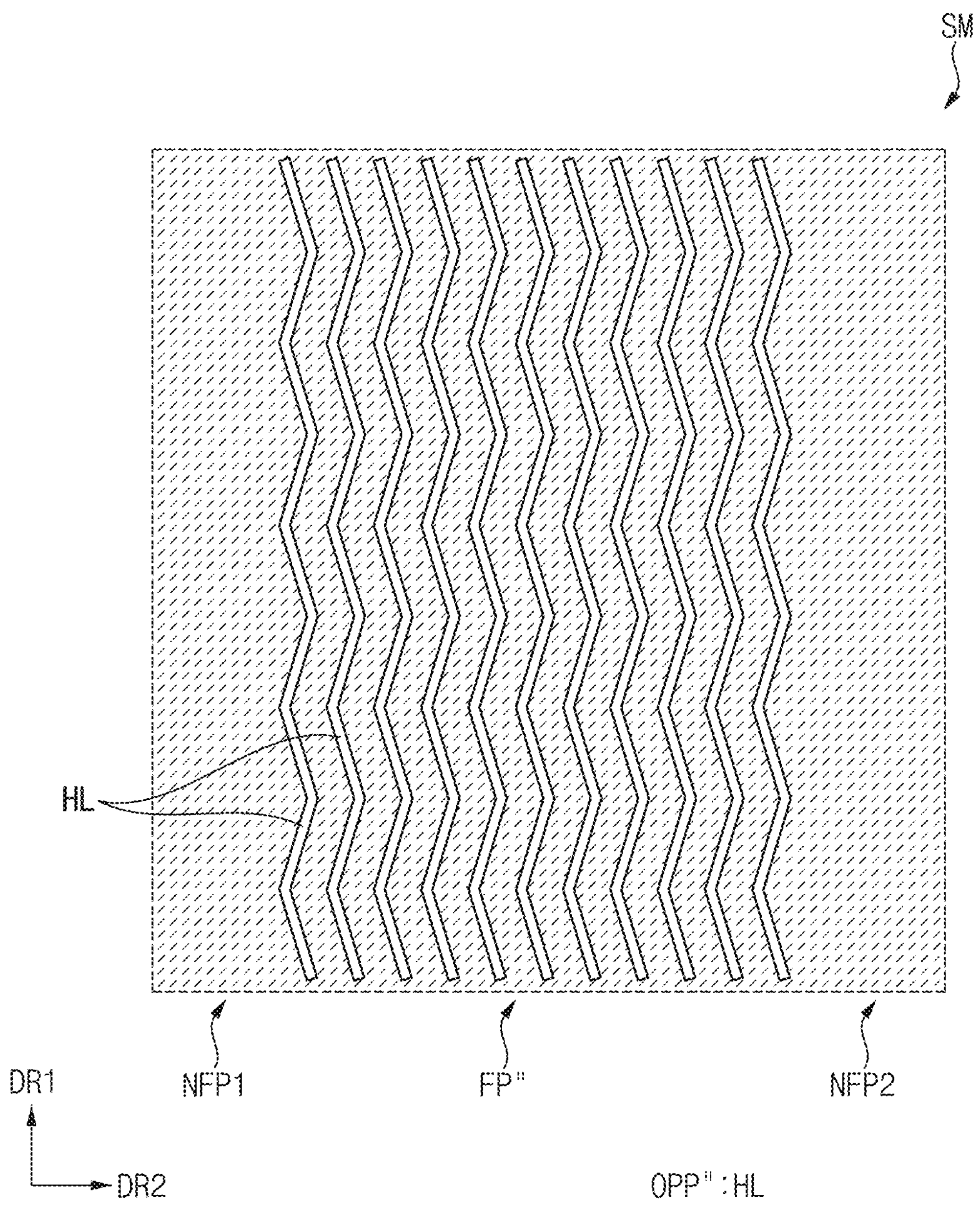
FIG. 8 is a schematic plan view illustrating the support member of FIG. 3 according to an embodiment.

Referring to FIG. 8, the opening pattern OPP" of the folding portion FP" may include the openings HL. Each of the openings HL may have a same shape such as a wavy shape or the like in a plan view. In the opening pattern OPP" of the folding portion FP", only one opening extending in the first direction DR1 may be disposed.

Figure 9:
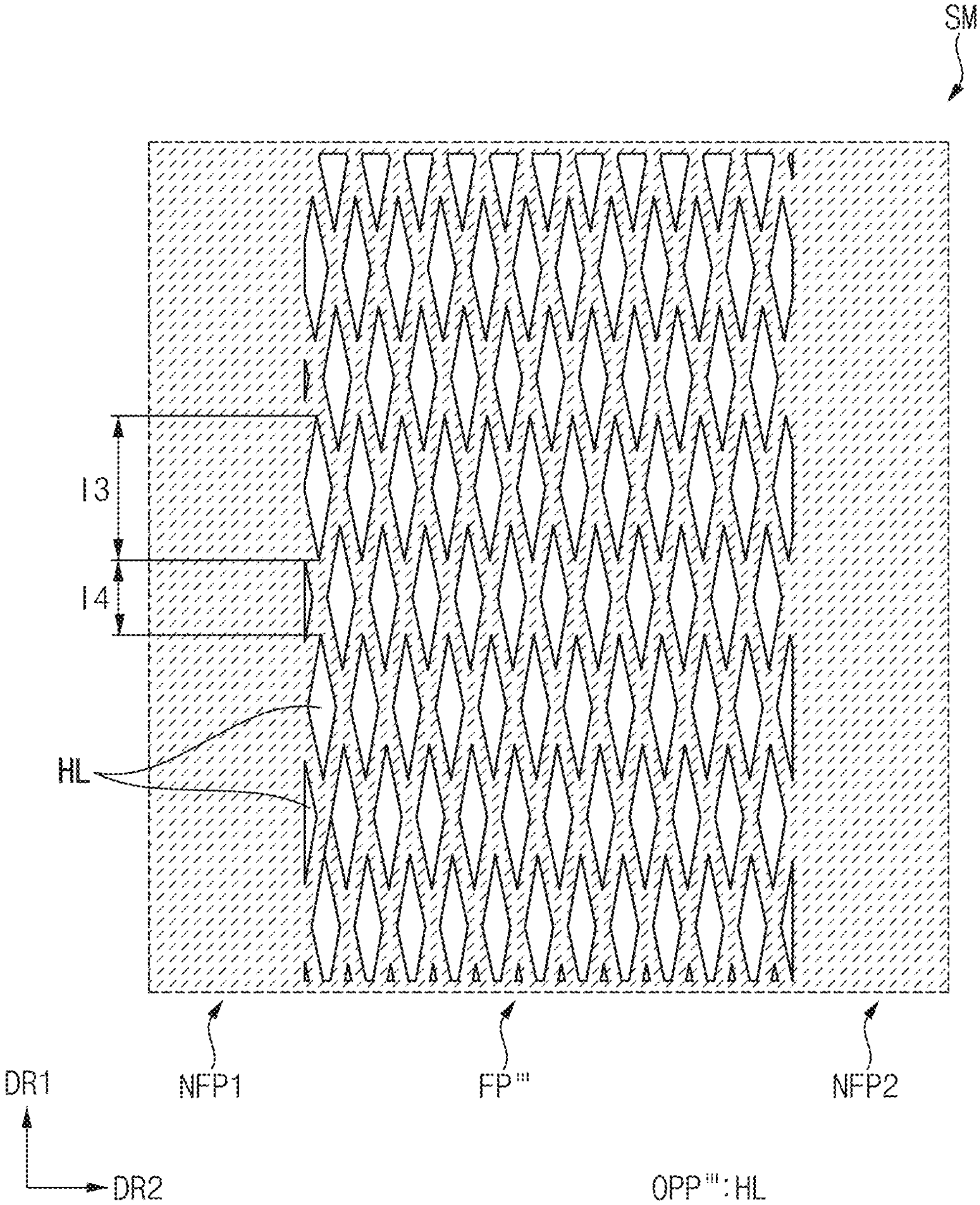
FIG. 9 is a schematic plan view illustrating the support member of FIG. 3 according to an embodiment.

Referring to FIG. 9, the opening pattern OPP"' of the folding portion FP"' may include the openings HL. Each of the openings HL may have a same shape such as a rhombus shape in a plan view. The openings HL may have a specific length l3 and linearly arranged openings HL may be spaced apart from each other by a specific interval l4 in the first direction DR1. The openings HL arranged in a column (or a specific column) may be aligned with or staggered with openings HL arranged in an adjacent column.

However, the disclosure is not limited thereto, and in other embodiments, a shape or a size of each of the openings HL may be different from each other. Also, in another embodiment, the openings HL may include a rectangular shape with rounded corners, an elliptical shape, or the like other than the above shapes.

In an embodiment, the display device 10 may include the opening pattern OPP, OPP', OPP", or OPP"' including the openings HL having the width W of in a range of about 10 micrometers to about 200 micrometers in the folding portion FP, FP', FP", or FP"' in the second direction DR2. An area of the support member SM supporting the lower portion of the display panel PNL may be increased. Accordingly, the impact resistance of the display device 10 may be improved. Also, cracks and creases of the display device 10 may be prevented or reduced, and the reliability of the display device 10 may be improved.

Figure 10:
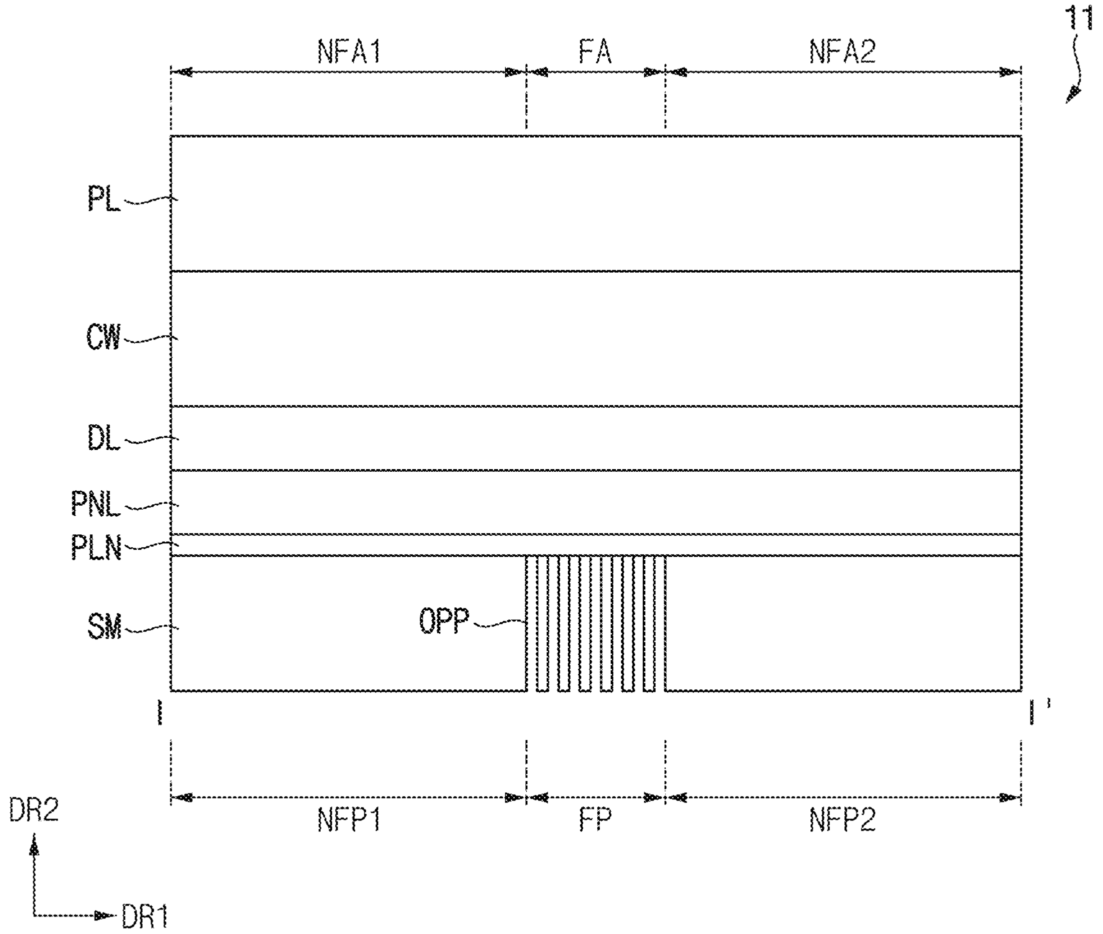
FIG. 10 is a schematic cross-sectional view illustrating a display device according to another embodiment.

FIG. 10 is a schematic cross-sectional view illustrating a display device according to another embodiment.

The display device 11 described with reference to FIG. 10 and the display device 10 described with reference to FIGS. 1 to 9 except for a planarization layer PLN may be substantially the same. Accordingly, redundant descriptions may be omitted or simplified.

Referring to FIG. 10, the display device 11 may further include a planarization layer PLN.

The planarization layer PLN may be disposed between the support member SM and the display panel PNL. The planarization layer PLN may cover an upper surface of the support member SM. The planarization layer PLN may flatten an upper surface of the support member SM. Therefore, even in case that the upper surface of the support member SM is not flat, the display panel PNL may be disposed on a flat upper surface by the planarization layer PLN.

FIGS. 11 to 19 are schematic views illustrating a manufacturing method of a display device according to an embodiment.

For example, a manufacturing method of the display device described with reference to FIGS. 11 to 19 may be a method of manufacturing the display device described with FIGS. 1 to 9. Accordingly, redundant descriptions may be omitted or simplified.

Figure 11:
FIGS. 11 to 19 are schematic views illustrating a manufacturing method of a display device according to an embodiment.

Referring to FIG. 11, a carrier substrate CSUB may be formed. The carrier substrate CSUB may be formed of a glass or the like. Also, a thickness T1' of the carrier substrate CSUB may be formed in a range of about 400 micrometers to about 500 micrometers.

Figure 12:
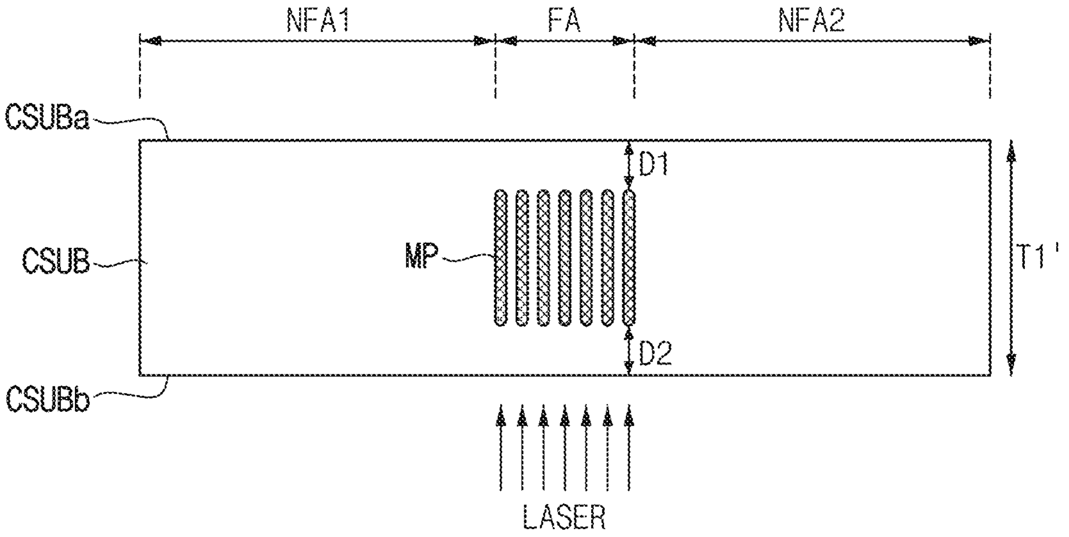

Referring to FIG. 12, a laser LASER may be radiated to the carrier substrate CSUB. A focus of the laser LASER may be formed on the carrier substrate CSUB. Accordingly, a modified portion MP may be formed on the carrier substrate CSUB. Multiple modified portions MP may be formed on the carrier substrate CSUB. Accordingly, the laser LASER may be radiated to the carrier substrate CSUB multiple times or multiple lasers LASER may be radiated to the carrier substrate CSUB.

The carrier substrate CSUB may include a first surface CSUBa and a second surface CSUBb opposite to the first surface CSUBa. The modified portion MP may be formed on the carrier substrate CSUB. For example, the modified portion MP may be spaced apart from the first surface CSUBa and the second surface CSUBb of the carrier substrate CSUB.

In an embodiment, the modified portion MP may be spaced apart by a length D1 corresponding to in a range of about 20% to about 80% of the thickness T1' of the carrier substrate CSUB from the first surface CSUBa of the carrier substrate CSUB in a thickness direction of the carrier substrate CSUB. Similarly, the modified portion MP may be spaced apart by a length D2 corresponding to in a range of about 20% to about 80% of the thickness T1' of the carrier substrate CSUB from the second surface CSUBb of the carrier substrate CSUB in the thickness direction of the carrier substrate CSUB. For example, the modified portion MP may be formed in an area spaced apart by a length corresponding to about 20% of the thickness T1' of the carrier substrate CSUB from each of the first surfaces CSUBa and the second surfaces CSUBb of the carrier substrate CSUB in the thickness direction of the carrier substrate CSUB.

For example, in case that the thickness T1' of the carrier substrate CSUB is about 500 micrometers, the modified portion MP may be formed in an area spaced apart by in a range of about 100 micrometers to about 400 micrometers from the first surface CSUBa or the second surface CSUBb in the thickness direction of the carrier substrate CSUB.

in case that the modified portion MP is spaced apart from the second surface CSUBb within about 20% of the thickness T1' of the carrier substrate CSUB in the thickness direction of the carrier substrate CSUB, during the carrier substrate CSUB is etched, the modified portion MP may be excessively etched. A width (see, e.g., a with W in FIG. 18) of each of openings (see, e.g., openings HL in FIG. 18) included in an opening pattern (see, e.g., an opening pattern OPP in FIG. 18) formed by the modified portion MP may be increased. As the width of each of the openings included in the opening pattern increases, an impact resistance of a support member (see, e.g., a support member SM in FIGS. 16 to 19) against the pen drop may decrease. Also, since the modulus of the support member is lowered, creases may occur in a folding portion (see, a folding portion FP in FIG. 18) of the support member, and a reliability of the display device (see, the display device 10 in FIG. 19) may decrease.

Figure 13:
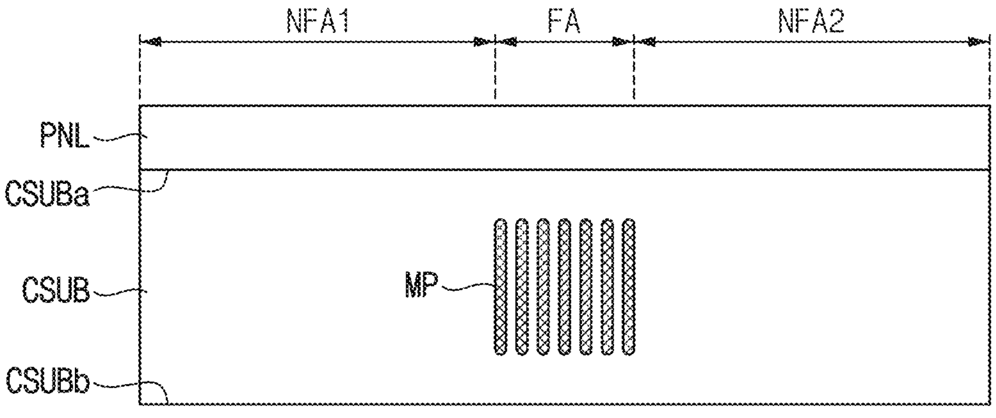

Referring to FIG. 13, the display panel PNL may be formed on the carrier substrate CSUB. The display panel PNL may contact (e.g., directly contact) the first surface CSUBa of the carrier substrate CSUB. The display panel PNL may include the first non-folding area NFA1, the second non-folding area NFA2, and the folding area FA between the first non-folding area NFA1 and the second non-folding area NFA2.

Referring to FIGS. 14 to 17, the support member SM may be formed by etching the carrier substrate CSUB. For example, the support member SM may be formed by forming the opening pattern OPP overlapping the folding area FA in a plan view.

Figure 14:
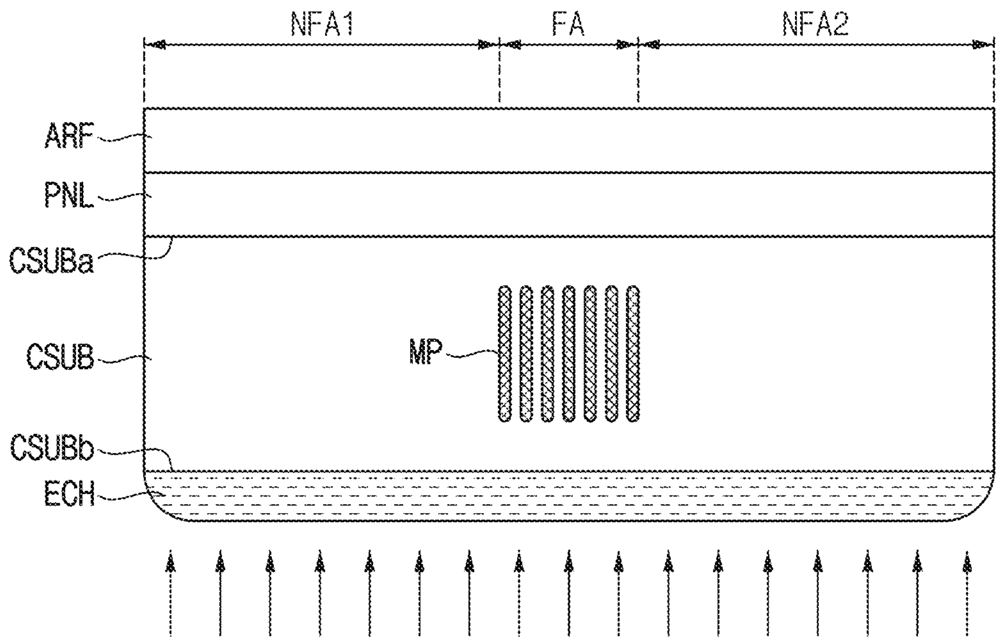

Referring to FIG. 14, an acid resistant film ARF may be formed on the display panel PNL. Also, the carrier substrate CSUB may be etched.

In an embodiment, an etchant ECH (or an etching solution ECH) may be applied under the carrier substrate CSUB. For example, the etchant ECH may be applied to an entire area of the second surface CSUBb of the carrier substrate CSUB. For example, the carrier substrate CSUB may be etched using a wet etching method or the like. The etchant ECH may include at least one of hydrogen fluoride, sodium hydroxide, and potassium hydroxide. However, the disclosure is not limited thereto.

in case that the carrier substrate CSUB is etched, an entire area of the second surface CSUBb of the carrier substrate CSUB may be uniformly etched until the modified portion MP is etched.

Figure 15:
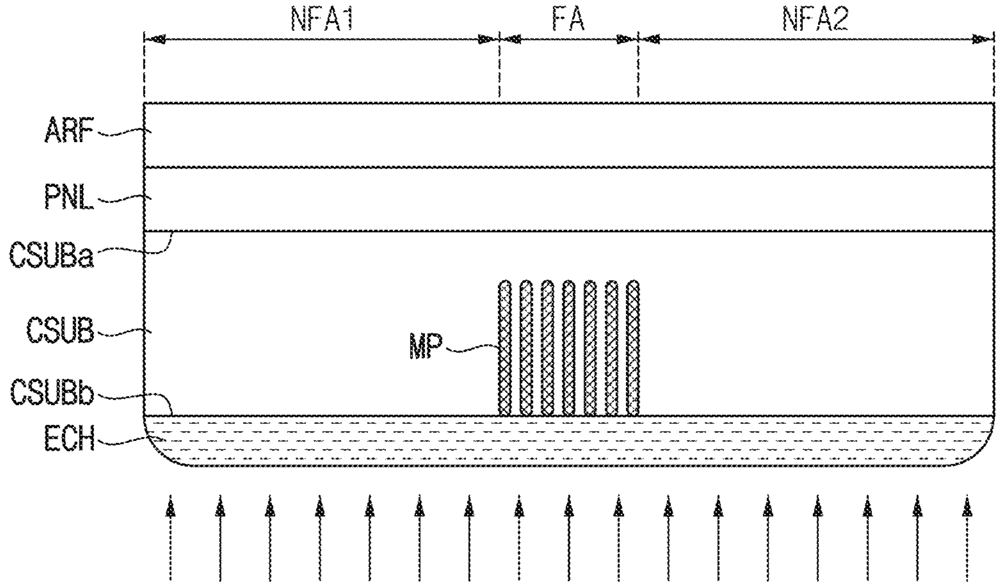

Referring further to FIG. 15, the modified portion MP of the carrier substrate CSUB may be etched.

In an embodiment, since the etchant ECH meets the modified portion MP, the modified portion MP may be etched faster than a remaining portion. For example, the modified portion MP formed by radiation of the laser LASER may be more readily etched by the etchant ECH. A process (i.e., a process of etching the modified portion MP formed by radiation of the laser LASER by the etchant ECH) may be a laser induced deep etching (LIDE) process. Therefore, an etching rate of the modified portion MP may be greater than an etching rate of the remaining portion.

Figure 16:
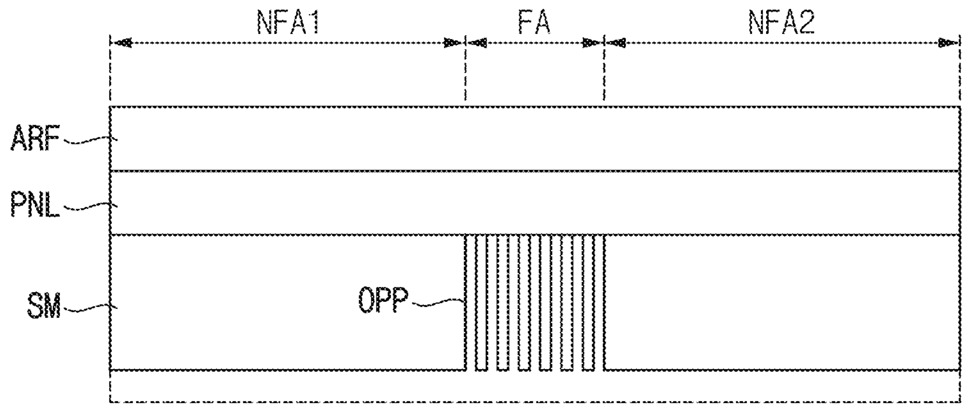

Further referring to FIG. 16, the modified portion MP may be etched more quickly to form the opening pattern OPP. A portion of the carrier substrate CSUB other than the modified portion MP may be etched to form the support member SM. The opening pattern OPP may be formed in the folding area FA.

Figure 17:
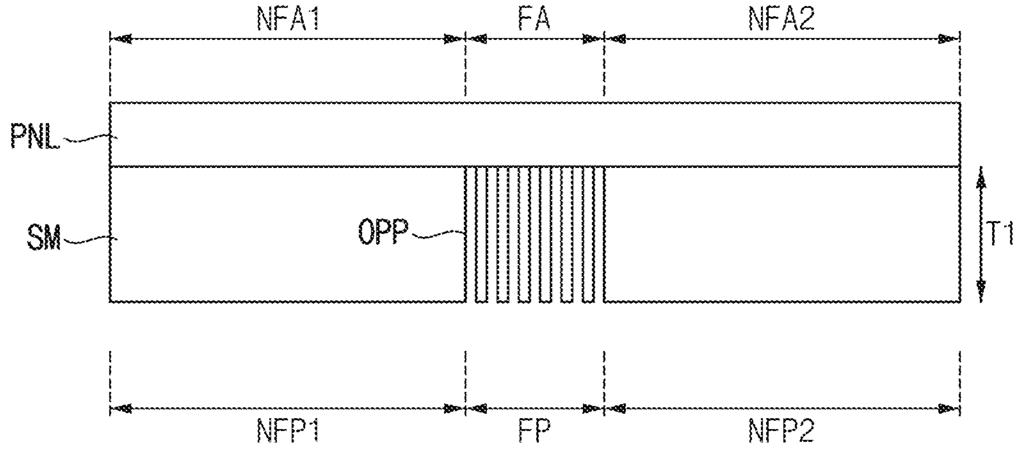
Figure 18:
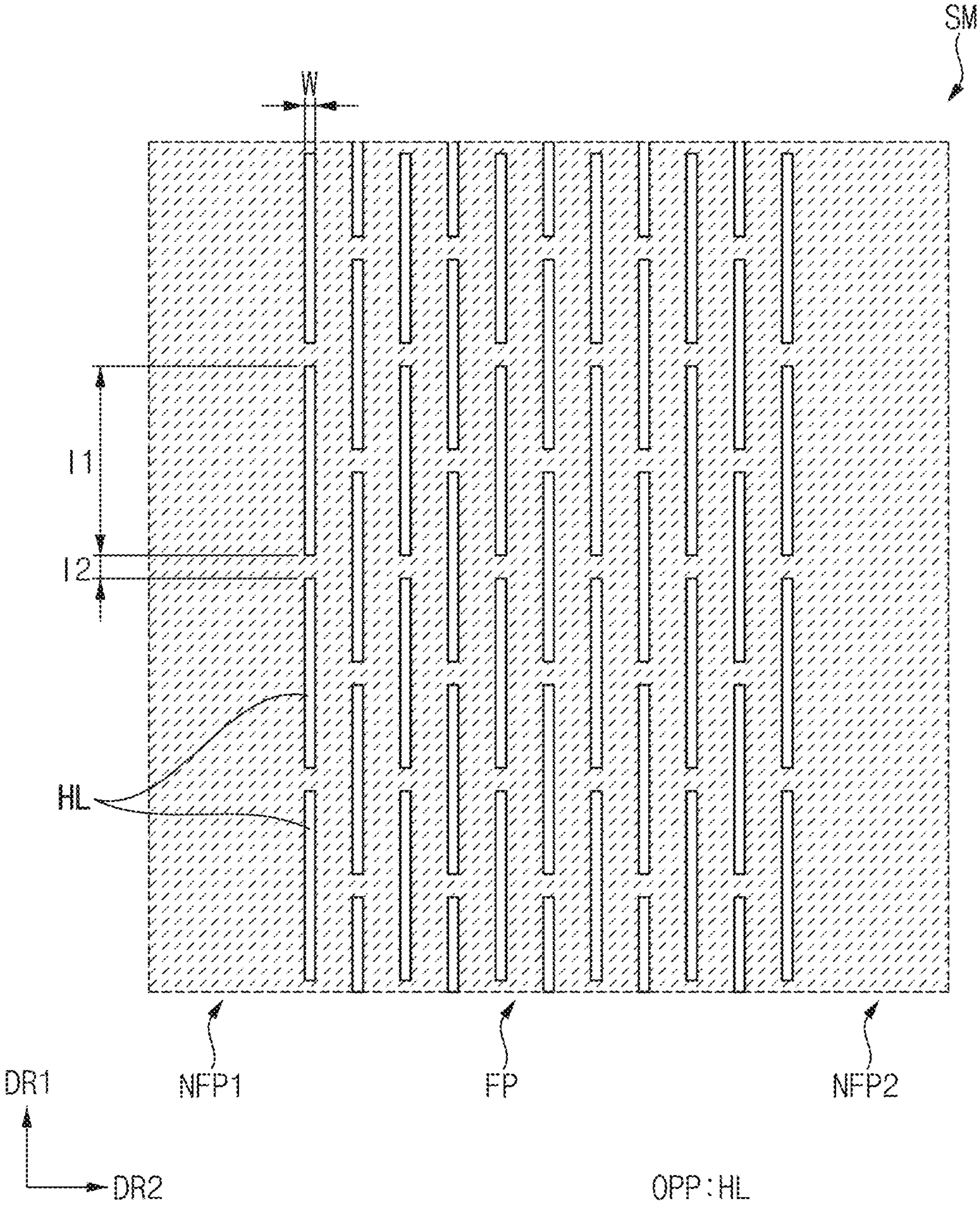

FIG. 18 is a schematic plan view illustrating a portion of the support member of FIG. 17.

Referring further to FIGS. 17 and 18, the opening pattern OPP may include the openings HL. Each of the openings HL may extend in the first direction DR1. Also, each of the openings HL may have a width W in the second direction DR2 in a range of about 10 micrometers to about 200 micrometers.

Since the support member SM is formed by etching the carrier substrate CSUB, the thickness T1 of the support member SM may be less than the thickness T1' of the carrier substrate CSUB in the thickness direction of the carrier substrate CSUB.

Figure 19:
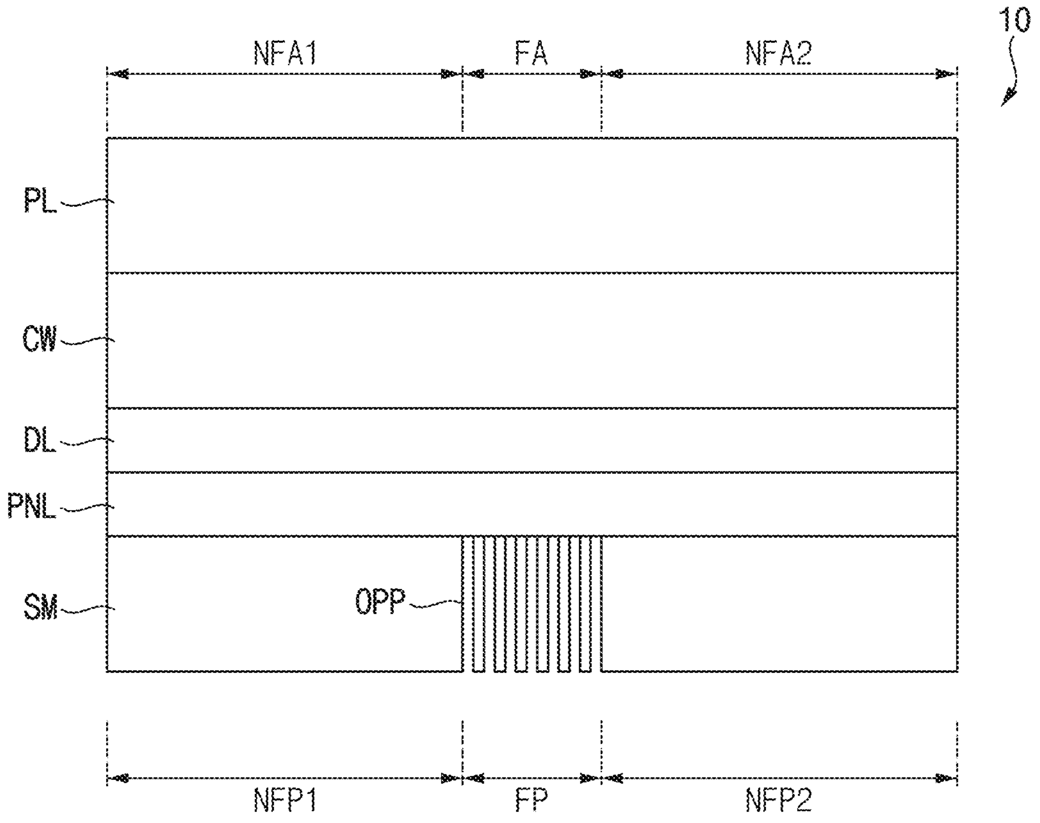

Referring further to FIG. 19, a damping layer DL may be formed on the display panel PNL. A cover window CW may be formed on the damping layer DL, and a protective film PL may be formed on the cover window CW. Thus, the display device 10 may be formed. In an embodiment, an adhesive layer may be formed between layers to attach the layers to each other. However, the disclosure is not limited thereto, and the adhesive layer may be omitted.

In an embodiment, since the modified portion MP is formed on the carrier substrate CSUB, the modified portion MP may not be etched from the beginning. Therefore, since the modified portion MP having a relatively higher etching rate is not etched from the beginning, the width W of each of the openings HL of the opening pattern OPP formed by the modified portion MP may be reduced. Accordingly, an area of the support member SM supporting a lower portion of the display panel PNL may be increased. Accordingly, the impact resistance of the display device 10 may be improved. Also, cracks and creases of the display device 10 may be prevented or reduced, and the reliability of the display device 10 may be improved.

FIGS. 20 to 26 are schematic views illustrating a manufacturing method of a display device according to another embodiment.

For example, a manufacturing method of the display device described with reference to FIGS. 20 to 26 and the method of manufacturing the display device described with FIGS. 11 to 19 except for a process of forming the support member SM may be substantially the same. Accordingly, redundant descriptions may be omitted or simplified.

Figure 20:
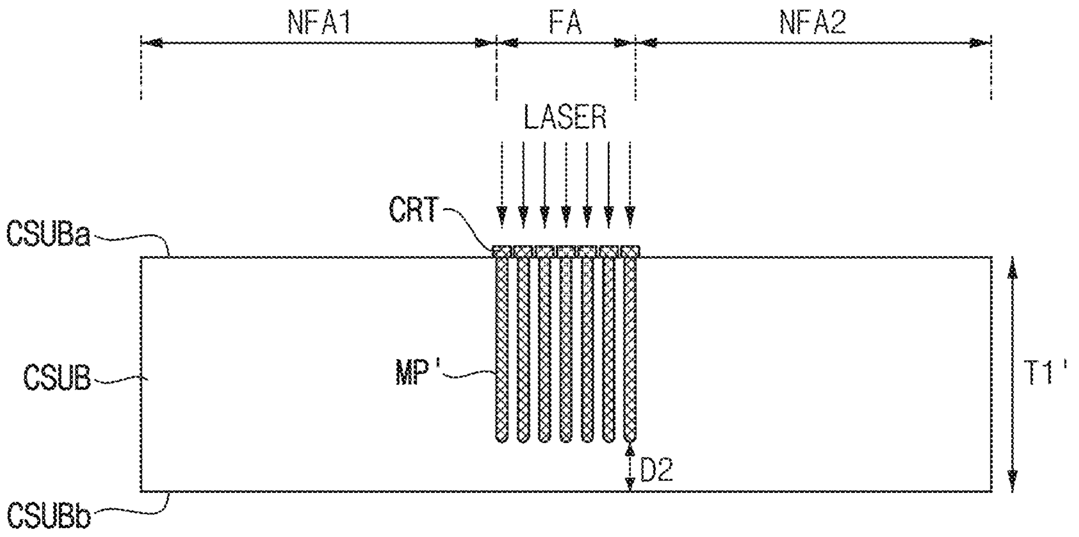
FIGS. 20 to 26 are schematic views illustrating a manufacturing method of a display device according to another embodiment.

Referring to FIG. 20, a laser LASER may be radiated to the carrier substrate CSUB. By radiating the laser LASER to the first surface CSUBa of the carrier substrate CSUB, a modified portion MP' may be formed in the first surface CSUBa of the carrier substrate CSUB. For example, the modified portion MP' may be formed from the first surface CSUBa of the carrier substrate CSUB and extend to the inside of the carrier substrate CSUB. Also, the modified portion MP' may be spaced apart from the second surface CSUBb in a thickness direction of the carrier substrate CSUB. For example, the modified portion MP may be spaced apart by a length D2 corresponding to in a range of about 20% to about 100% of the thickness T1' of the carrier substrate CSUB from the second surface CSUBb of the carrier substrate CSUB in the thickness direction of the carrier substrate CSUB. For example, a thickness of the modified portion MP' may be in a range of about 0% to about 80% of the thickness T1' of the carrier substrate CSUB.

Figure 21:
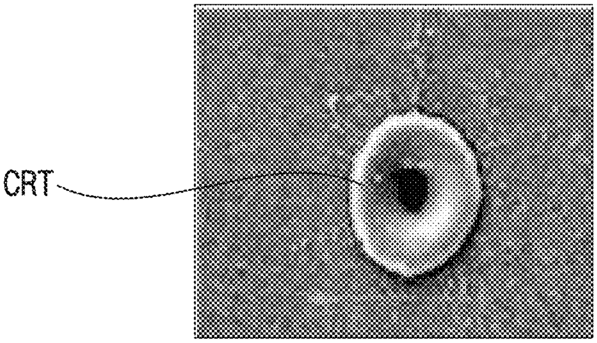

FIG. 21 is a schematic enlarged plan view of a portion of the first surface CSUBa of the carrier substrate CSUB of FIG. 20.

Referring to FIG. 21, since the modified portion MP' is formed on the first surface CSUBa of the carrier substrate CSUB, a crater CRT may be formed on the first surface CSUBa of the carrier substrate CSUB. The crater CRT may be a protrusion formed on a surface of the carrier substrate CSUB by being radiated with the laser LASER.

Figure 22:
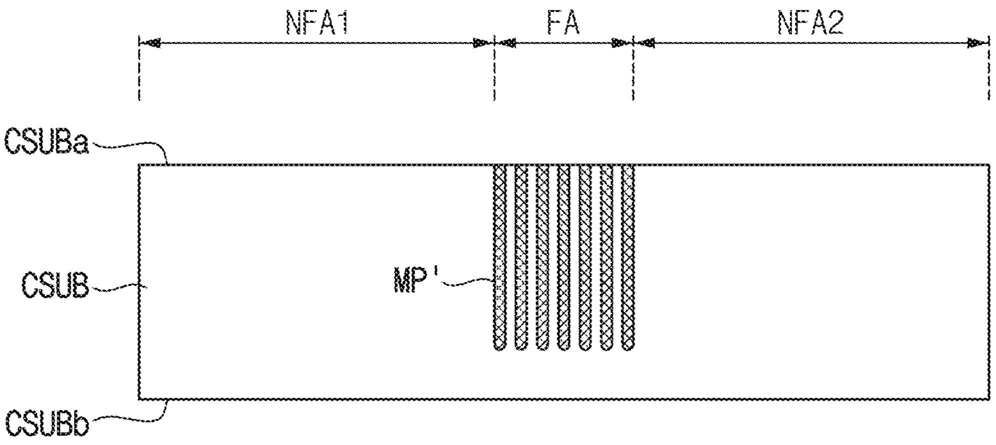

Referring further to FIG. 22, the first surface CSUBa of the carrier substrate CSUB may be planarized. For example, a chemical or mechanical polishing (CMP) may be performed on the first surface CSUBa of the carrier substrate CSUB. However, a planarization process of the disclosure is not limited thereto.

As the first surface CSUBa of the carrier substrate CSUB is planarized, the display panel PNL may be formed on the first surface CSUBa of the carrier substrate CSUB which is flat. Accordingly, the reliability of the display device 10 may be improved.

Figure 23:
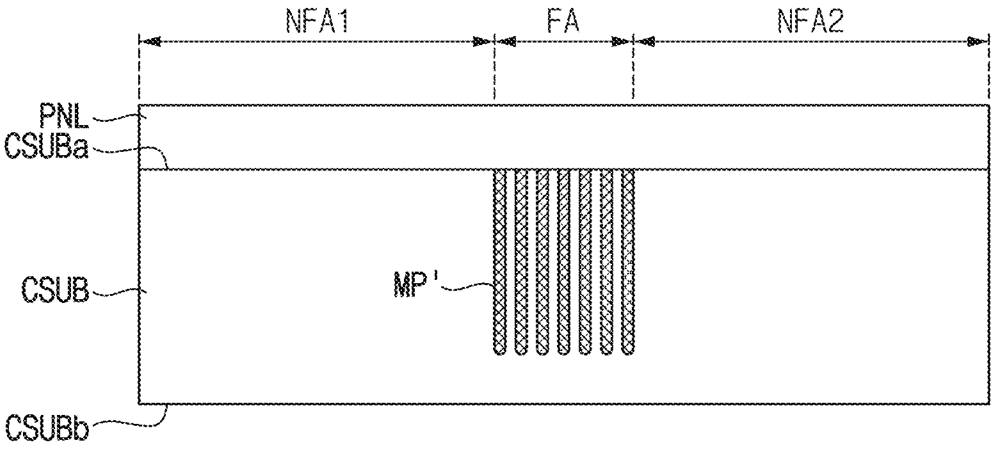

Referring to FIG. 23, the display panel PNL may be formed on the first surface CSUBa of the planarized carrier substrate CSUB. The display panel PNL may contact (e.g., directly contact) the first surface CSUBa of the carrier substrate CSUB. The display panel PNL may include the first non-folding area NFA1, the second non-folding area NFA2, and the folding area FA.

Figure 24:
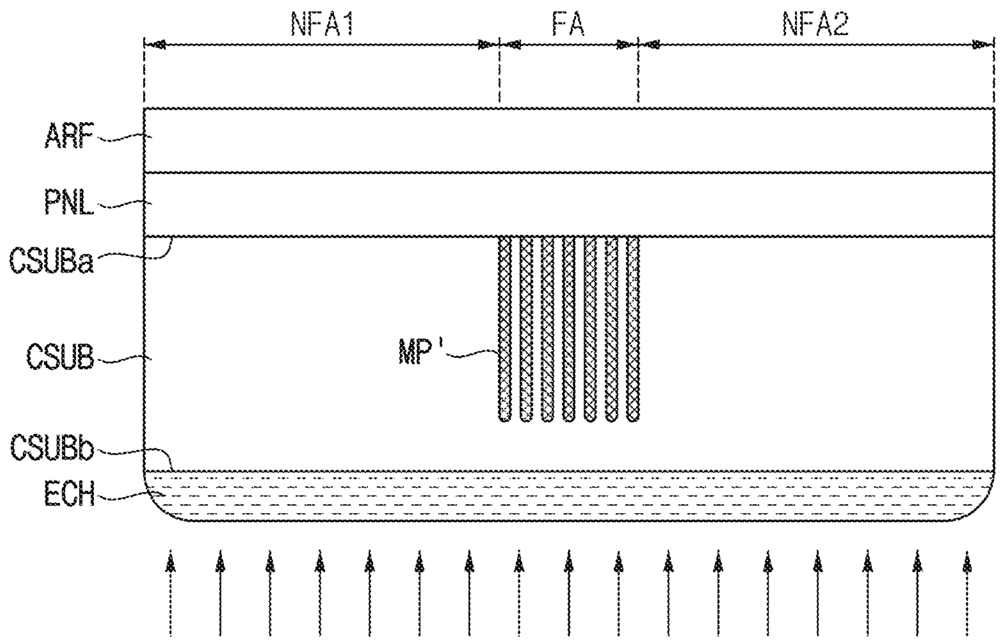
Figure 25:
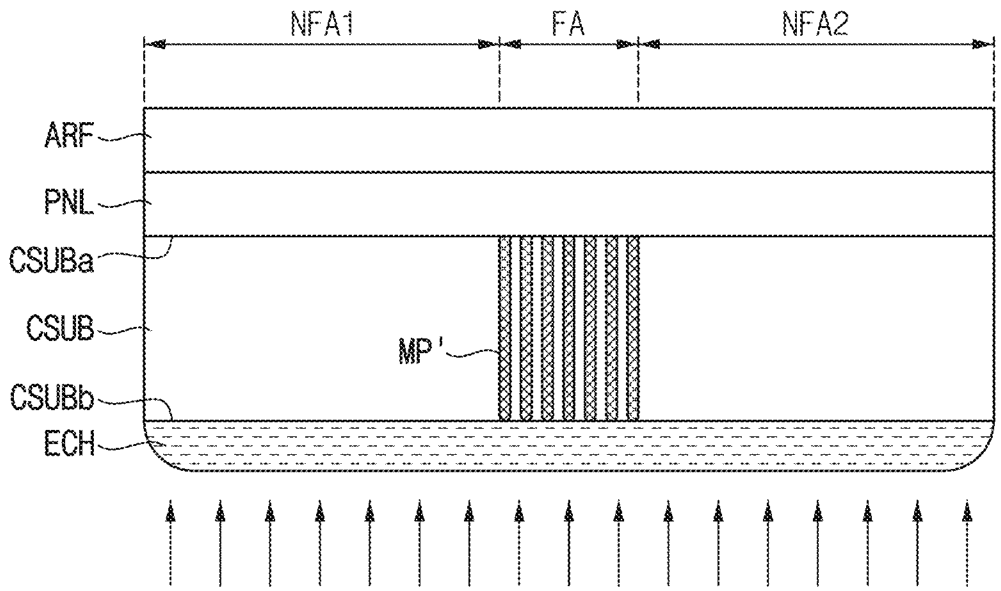
Figure 26:
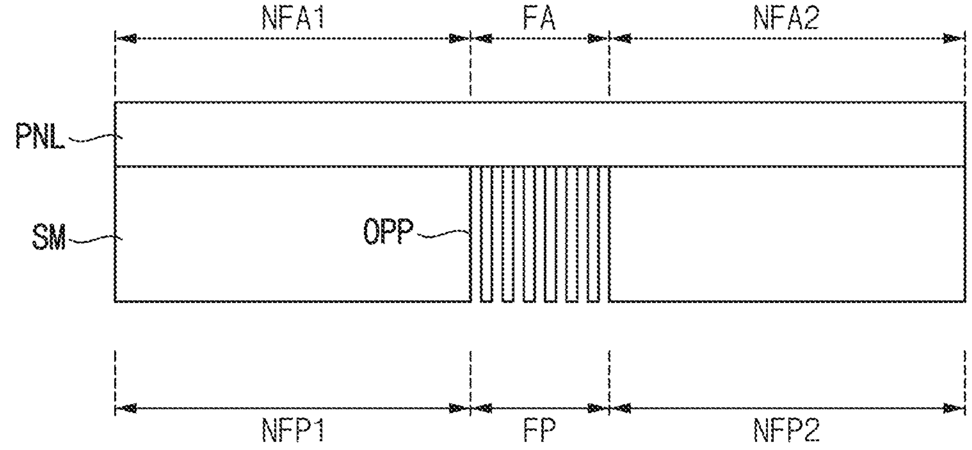

Referring to FIGS. 24 to 26, the support member SM may be formed by etching the carrier substrate CSUB. For example, the support member SM may be formed by forming the opening pattern OPP overlapping the folding area FA in a plan view.

Referring to FIG. 24, in an embodiment, an etchant ECH (or an etching solution ECH) may be applied under the carrier substrate CSUB. For example, the etchant ECH may be applied on an entire area of the second surface CSUBb of the carrier substrate CSUB. in case that the carrier substrate CSUB is etched, an entire area of the second surface CSUBb of the carrier substrate CSUB may be uniformly etched until the modified portion MP' is etched.

Referring further to FIG. 25, in an embodiment, since the etchant ECH meets the modified portion MP', the modified portion MP' may be etched faster than the remaining portion. For example, an etching rate of the modified portion MP' may be greater than an etching rate of a portion of the carrier substrate CSUB other than the modified portion MP.

Further referring to FIG. 26, the modified portion MP' may be etched more quickly to form the opening pattern OPP. A portion of the carrier substrate CSUB other than the modified portion MP' may be etched to form the support member SM. The opening pattern OPP may be formed in the folding area FA.

In an embodiment, since the modified portion MP' is spaced apart from the second surface CSUBb on which the etchant ECH is applied in a thickness direction of the carrier substrate CSUB, the modified portion MP' may not be etched from the beginning. Therefore, since the modified portion MP' having a relatively higher etching rate is not etched from the beginning, the width W of each of the openings HL of the opening pattern OPP formed by the modified portion MP' may be reduced.

Also, since the first surface CSUBa of the carrier substrate CSUB is planarized, the display panel PNL may be formed on a flat upper surface (e.g., the flat first surface CSUBa) of the carrier substrate CSUB. Therefore, the crater CRT formed on the first surface CSUBa of the carrier substrate CSUB may not affect the display panel PNL, and the reliability of the display device 10 may be improved.

FIGS. 27 to 30 are schematic cross-sectional views illustrating a manufacturing method of a display device according to another embodiment.

For example, the manufacturing method of the display device described with reference to FIGS. 27 to 30 may be a method of manufacturing the display device 11 of FIG. 10. A manufacturing method of the display device described with reference to FIGS. 27 to 30 and the method of manufacturing the display device described with FIGS. 20 to 26 except for a process of performing a planarization may be substantially same. Accordingly, redundant descriptions may be omitted or simplified.

Figure 27:
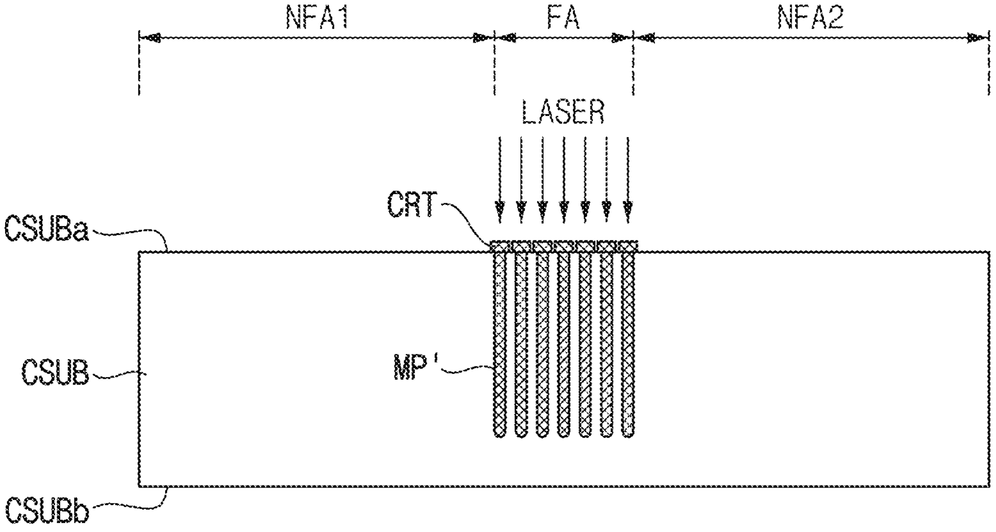
FIGS. 27 to 30 are schematic cross-sectional views illustrating a manufacturing method of a display device according to another embodiment.

Referring to FIG. 27, a laser LASER may be radiated to the carrier substrate CSUB. By radiating the laser LASER to the first surface CSUBa of the carrier substrate CSUB, the modified portion MP' may be formed on the first surface CSUBa of the carrier substrate CSUB. For example, the modified portion MP' may be formed from the first surface CSUBa of the carrier substrate CSUB and extend to the inside of the carrier substrate CSUB. Also, the modified portion MP' may be spaced apart from the second surface CSUBb in a thickness direction of the carrier substrate CSUB.

As the modified portion MP' is formed on the first surface CSUBa of the carrier substrate CSUB, the crater CRT may be formed on the first surface CSUBa of the carrier substrate CSUB.

Figure 28:
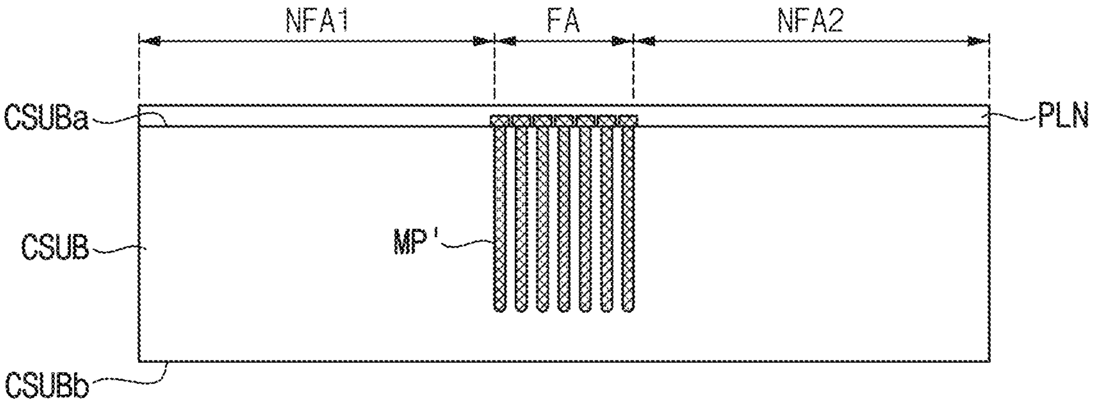

Referring further to FIG. 28, the first surface CSUBa of the carrier substrate CSUB may be planarized. For example, the planarization layer PLN may be formed on the first surface CSUBa of the carrier substrate CSUB. Since the planarization layer PLN covers the crater CRT, an upper surface of the planarization layer PLN may be planarized. However, the planarization process of the disclosure is not limited thereto.

Figure 29:
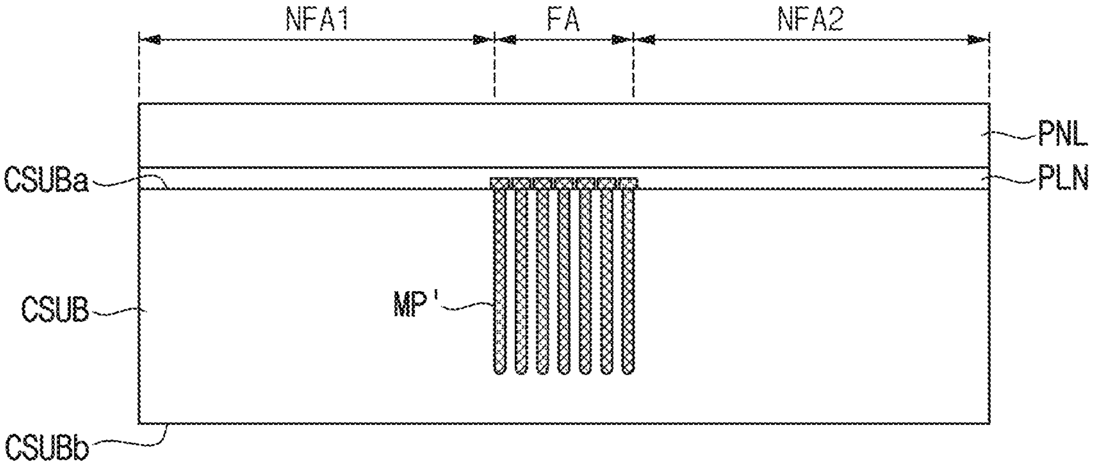
Figure 30:
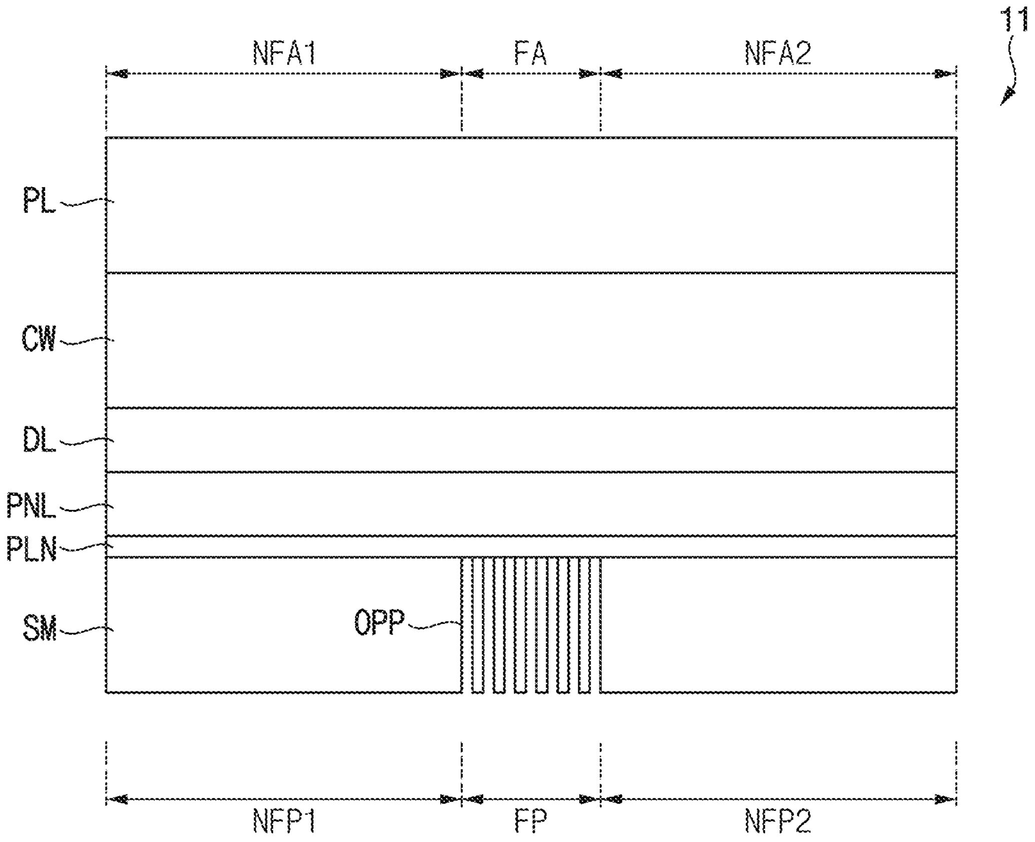

Referring to FIGS. 29 and 30, the display panel PNL may be formed on the planarized upper surface of the planarization layer PLN. The display panel PNL may contact (e.g., directly contact) the upper surface of the planarization layer PLN which is planarized. Thus, the display device 11 including the planarization layer PLN may be formed.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of manufacturing a display device, the method comprising:

forming a carrier substrate comprising a glass;

forming a modified portion in the carrier substrate by radiating a laser on the carrier substrate;

forming a display panel on a first surface of the carrier substrate and comprising a first non-folding area, a second non-folding area, and a folding area disposed between the first non-folding area and the second non-folding area on the carrier substrate; and forming a support member by etching the carrier substrate to form an opening pattern overlapping the folding area in a plan view, wherein the modified portion is spaced apart from a second surface of the carrier substrate opposite to the first surface by a distance in a range of 20% to 80% of a thickness of the carrier substrate in a thickness direction of the carrier substrate.

2. The method of claim 1, wherein the forming of the display panel is performed after the forming of the modified portion.

3. The method of claim 1, wherein the forming of the support member comprises forming the opening pattern by etching the modified portion.

4. The method of claim 3, wherein an etching rate of the modified portion is greater than an etching rate of a portion of the carrier substrate other than the modified portion.

5. The method of claim 1, wherein the modified portion overlaps the folding area in a plan view.

6. The method of claim 1, wherein the opening pattern comprises openings, and each of the openings extends in a first direction and has a width in a second direction intersecting the first direction in a range of about 10 micrometers to about 200 micrometers.

7. The method of claim 1, wherein the modified portion is spaced apart from the first surface of the carrier substrate and the second surface of the carrier substrate.

8. The method of claim 1, wherein the modified portion is spaced apart from the first surface of the carrier substrate by a distance in a range of 20% to 80% of the thickness of the carrier substrate in the thickness direction of the carrier substrate.

9. The method of claim 1, wherein the etching of the carrier substrate is performed by a wet etching method.

10. The method of claim 9, wherein in the etching of the carrier substrate, an etching solution is applied on an entire area of the second surface.

11. The method of claim 10, wherein the etching solution comprises at least one of hydrogen fluorine, sodium hydroxide, and potassium hydroxide.

12. The method of claim 1, wherein the etching of the carrier substrate comprises etching an unmodified portion of the carrier substrate between the second surface of the carrier substrate and the modified portion to expose the modified portion.

13. The method of claim 12, wherein the etching of the carrier substrate further comprises subsequently etching the modified portion after the modified portion is exposed.

14. A method of manufacturing a display device, the method comprising:

forming a carrier substrate comprising a glass;

forming a modified portion on a first surface of the carrier substrate by radiating a laser on the first surface of the carrier substrate;

forming a display panel on the first surface of the carrier substrate and comprising a first non-folding area, a second non-folding area, and a folding area disposed between the first non-folding area and the second non-folding area on the carrier substrate; and forming a support member by etching the carrier substrate to form an opening pattern overlapping the folding area in a plan view, wherein the modified portion is spaced apart from a second surface of the carrier substrate opposite to the first surface by a length in a range of 20% to 80% of a thickness of the carrier substrate in a thickness direction of the carrier substrate.

15. The method of claim 14, wherein the modified portion extends from the first surface of the carrier substrate to inside of the carrier substrate, and is spaced apart from the second surface opposite to the first surface of the carrier substrate.

16. The method of claim 14, further comprising:

performing a planarization of the first surface of the carrier substrate before the forming of the display panel.

* * * * *